(12) United States Patent
Abou

(10) Patent No.: US 7,733,082 B2
(45) Date of Patent: Jun. 8, 2010

(54) SIGNAL TRANSMISSION DEVICE

(75) Inventor: Shouji Abou, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 358 days.

(21) Appl. No.: 11/710,929

(22) Filed: Feb. 27, 2007

(65) Prior Publication Data

US 2007/0205748 A1  Sep. 6, 2007

(30) Foreign Application Priority Data

Mar. 1, 2006  (JP)  ............... 2006-055318

(51) Int. Cl.
  *H01F 5/00*  (2006.01)
  *G01R 33/06*  (2006.01)
  *H01L 43/08*  (2006.01)
(52) U.S. Cl. ............... 324/207.15; 324/207.2; 324/207.21
(58) Field of Classification Search ............... 324/713, 324/207.15
See application file for complete search history.

(56) References Cited

U.S. PATENT DOCUMENTS 6,146,526 A * 11/2000 Pandolfo ............... 210/222
6,859,063 B2   2/2005 Nuspl et al.

(Continued)

FOREIGN PATENT DOCUMENTS

DE        648 370      7/1937

(Continued)

OTHER PUBLICATIONS

Japanese Office Action dated Apr. 7, 2009.

(Continued)

*Primary Examiner*—Edward Tso
*Assistant Examiner*—Ahmed Omar
(74) *Attorney, Agent, or Firm*—Finnegan, Henderson, Farabow, Garrett & Dunner, LLP

(57) ABSTRACT

The invention provides a signal transmission device that transmits a signal applied to a pair of input terminals to a pair of output terminals insulated electrically from the pair of input terminals while reducing the influence of an external noise magnetic field. The signal transmission device has a pair of coils, a pair of magnetic sensors and a signal output section. Each of the coils is connected between the pair of input terminals. Each of the coils generates a magnetic field respectively in response to the input signal applied between the pair of input terminals. A direction of the magnetic field generated by one of the coils is opposite to a direction of the magnetic field generated by the other of the coils. Each of the magnetic sensors corresponds to one of the coils exclusively. Each of the magnetic sensors detects the magnetic field generated by the corresponding coil, and outputs a detection signal in response to the detected magnetic field. The signal output section outputs an output signal to the pair of output terminals. The output signal corresponds to a difference between the pair of detection signals outputted by the pair of magnetic sensors. In the difference, the signal component caused by an external noise magnetic field is canceled. On the other hand, in the difference, the signal component caused by the input signal applied between the pair of input terminals are doubled with respect to the input signal. Thereby, the signal output section outputs the output signal with high S/N ratio.

4 Claims, 12 Drawing Sheets

U.S. PATENT DOCUMENTS 7,327,131 B2    2/2008    Ezzeddine

FOREIGN PATENT DOCUMENTS

| DE | 1 826 651 | 3/1959 |
| DE | 298 05 631 | 6/1998 |
| FR | 2 293 045 | 6/1976 |
| JP | 51-96342 | 1/1950 |
| JP | 57-102159 | 12/1955 |
| JP | 57-048264 | 3/1982 |
| JP | 57-48265 | 3/1982 |
| JP | 4-185396 | 7/1992 |
| JP | 07-213057 | 8/1995 |
| JP | 8-264857 | 10/1996 |
| JP | 10-107708 | 4/1998 |
| JP | 10-509849 | 9/1998 |
| JP | 2003-273754 | 9/2003 |
| JP | 2004-348636 | 12/2004 |
| JP | 2004348636 A * | 12/2004 |
| JP | 2005-051021 | 2/2005 |
| WO | WO 96-15541 | 5/1996 |

OTHER PUBLICATIONS

German Office Action dated Aug. 26, 2008.
First Office Action dated Jul. 3, 2009, from the Chinese Patent Office for CN 200710005613.4.
English-language transalation of JP 10-107708 dated Apr. 24, 1998.
Notice of Reasons for Rejection from the Japanese Patent Office, dated Dec. 8, 2009, for JP 2006-055318.

* cited by examiner

SIGNAL TRANSMISSION DEVICE

CROSS REFERENCE TO RELATED APPLICATION

This application claims priority to Japanese Patent Application No. 2006-055318 filed on Mar. 1, 2006, the contents of which are hereby incorporated by reference into the present application.

BACKGROUND OF THE INVENTION

1. Field of the Invention

The present invention relates to a signal transmission device that transmits an input signal from a pair of input terminals to a pair of output terminals that are electrically insulated from the pair of input terminals. Specifically, the present invention relates to a signal transmission device that can reduce the influence of an external noise magnetic field during signal transmission.

2. Description of the Related Art

Signal transmission devices for transmitting a signal from a pair of input terminals to a pair of output terminals that are electrically insulated from the input terminals are known. One of such signal transmission devices is a device for transmitting a signal using a coil and a magnetic sensor which is insulated from the coil electrically but joined to the coil magnetically.

A representative example of such a device is a transformer. A transformer has an input side coil that is connected to a pair of input terminals and an output side coil that is connected to a pair of output terminals. The input side coil and the output side coil are electrically insulated from each other but magnetically joined with each other. Through electromagnetic induction of the transformer, a signal that is inputted from the pair of input terminals to the input side coil can be transmitted to the pair of output terminals without electrical connection between the pair on input terminals and the output terminals.

There are transformers in which the voltage level of an outputted signal is different from the voltage level of an inputted signal. There are also transformers, such as pulsing transformers, in which the voltage level of an outputted signal is same as the voltage level of an inputted signal.

A signal transmission device that transmits signal from the pair of input terminals to the pair of output terminals insulated electrically from the pair of input terminals can also be realized by using an element such as a hall element or a magnetoresistive element for outputting a signal in response to an acting magnetic field, instead of using the output side coil of the transformer.

In the present specification, the section in the signal transmission device that transmits a signal via a magnetic field in a state of electrical insulation is referred to as a "signal transmission section". A transformer is an example of a signal transmission section. Moreover, in the signal transmission device, the section that outputs a signal in response to an acting magnetic field is generically referred to as a "magnetic sensor". Examples of magnetic sensors are the output side coils and the hall elements or magnetoresistive elements that can be used in place of the output side coils. The output side coil may be referred as the "detection coil". A signal that is outputted by the magnetic sensor may be referred to as a "detection signal". In the signal transmission device, a section that outputs a signal in response to a signal inputted to the pair of input terminals, on the basis of the detection signal outputted by the magnetic sensor, is referred to as a "signal outputting section".

Even a signal transmission section alone, such as a transformer, can transmit signal from the pair of input terminals to the output terminals that are electrically insulated from the pair of input terminals. However, when the device transmits a signal via a magnetic field, the magnetic sensor detects not only the magnetic field generated by the input side coil but also an external noise magnetic field. An external noise magnetic field is, for example, the magnetic field generated by other equipments or circuits, or the magnetic field caused by the earth magnetism. The detection signal that is outputted by the magnetic sensor of the signal transmission section includes the signal (that should be transmitted) that results from the magnetic field generated by the input side coil, and a signal (that should not be transmitted) that is caused by an external noise magnetic field. In a signal transmission device in which signal is transmitted using a coil and a magnetic sensor that both are magnetically joined with each other but electrically insulated from each other, it is important to reduce noise signals caused by an external noise magnetic field.

In the present specification, "a signal that should be transmitted essentially", which is included in the detection signal outputted by the magnetic sensor of the signal transmission section, is referred to as "an essential signal" hereinafter. "A signal that should not be transmitted", which is included in the detection signal and is caused by a noise magnetic field, is referred to as "a noise signal" hereinafter.

Japanese Patent Application Laid-Open No. 2005-51021 discloses an example of a signal transmission device that reduces a noise signal included in a detection signal outputted from an output side coil of a transformer. In this signal transmission device, a dummy coil is arranged in the vicinity of the output side coil of the transformer. In the detection signal that is outputted from the output side coil of the transformer, a noise signal is added to an essential signal. The dummy coil outputs only the noise signal generated by a noise magnetic field. By determining the difference between a detection signal outputted from the output side coil of the transformer and the noise signal outputted by the dummy coil, the noise signal can be reduced from the detection signal outputted from the output side coil of the transformer.

BRIEF SUMMARY OF THE INVENTION

In the signal transmission device disclosed in Japanese Patent Application Laid-Open No. 2005-51021, a noise signal is reduced from the detection signal outputted from the output side coil of the transformer, by providing the dummy coil.

However, if the signal transmission device is placed in an environment where a strong noise magnetic field exists (in the vicinity of an IGBT, for example), the ratio (normally referred to as "S/N ratio") between the essential signal and the noise signal included in the detection signal of the output side coil decreases. When the S/N ratio decreases, a slight difference between the noise signal outputted by the dummy coil and the noise signal included in the detection signal outputted by the signal transmission section becomes significant. Therefore, an input signal that is inputted into the pair of input terminals of the signal transmission device may not be transmitted accurately to the pair of output terminals.

A signal transmission device, which effectively reduces a influence of an external noise magnetic field, when the signal that is inputted into the pair of input terminals is transmitted to the pair of output terminals that are electrically insulated from the input terminals, is desired.

The signal transmission device of the present invention comprises a pair of coils and a pair of magnetic sensors that are electrically insulated from the coils respectively but are joined therewith magnetically. Each of the coils generates a magnetic field respectively in response to a signal (an input signal) that is applied between a pair of input terminals. The pair of coils is arranged such that a direction of the magnetic field generated by one of the coils is opposite to a direction of the magnetic field generated by the other of the coils when the input signal is applied between the pair of input terminals.

Incidentally, a noise magnetic field acts on the pair of magnetic sensors is a substantially uniform manner. Therefore, in the case where the direction of the magnetic field generated by one of the coils is the same as the direction of the noise magnetic field, the direction of the magnetic field generated by the other of the coils is opposite to the direction of the noise magnetic field. Accordingly, the relationship between a polarity of an essential signal and a polarity of a noise signal, the both signals being included in the detection signal of one of the magnetic sensors, is opposite to the relationship between a polarity of an essential signal and a polarity of a noise signal included in the detection signal of the other of the magnetic sensors.

Here, "polarity of signal" means a direction of fluctuation (increase or decrease) of a level of the signal. For example, when one signal level increases at the same time as when the other signal level increases, the polarities of both signals are expressed as being "same". Alternatively, the both signals are expressed to have "same polarity". In other words, "same polarity" means that the level of each of the two signals increases and decreases simultaneously with respect to time.

Furthermore, for example, in a case where one signal increases while the other signal decreases, the both signals are expressed to have polarities that are opposite to each other. Alternatively, the signals are expressed to have "opposite polarities". In other words, "opposite polarities" means that the positive or negative fluctuation of one of the signals is opposite to the positive or negative fluctuation of the other signal with respect to time.

For example, in the present invention, when the voltage level of the detection signal of one of the magnetic sensors is equal to +6V, which includes a noise signal equal to +1V and an essential signal equal to +5V, the voltage level of the detection signal of the other magnetic sensor is equal to +4V, which includes a noise signal equal to −1V and the essential signal equal to +5V. Therefore, a signal with a voltage level of +10V is obtained by adding together the detection signals of both magnetic sensors. In the obtained +10V signal, the noise signals included in the detection signals of both magnetic sensors are cancelled out and the level of the essential signal is doubled with respect to the level of the original essential signal. As a result, the magnitude of the essential signal is increased as the magnitude of the noise signal is decreased, thus resulting in a significantly improved S/N ratio.

In the present invention, when the detection signals of the pair of magnetic sensors are added together, a signal in which the noise signal is canceled and the level of the essential signal is doubled can be obtained. By generating such signal, the signal that is outputted by the signal transmission device has an increased S/N ratio between the essential signal and the noise signal corresponding to the input signal. A signal transmission device which effectively reduces the influence of the noise magnetic field can be realized by using the principle of the present invention described above.

Depending on the arrangement or connection of the magnetic sensors, polarities of the essential signals, that are included in the detection signals outputted by the pair of magnetic sensors, are opposite to each other, and the noise signals having same polarity can be obtained. In this case, the same effect can be obtained by subtracting the detection signal of one of the magnetic sensor from the detection signal of the other magnetic sensor.

Adding the detection signals outputted by the pair of magnetic sensors is the same as inverting the level of one of the detection signals (from positive to negative, or from negative to positive) and subtracting the resulting inverted detection signal from the other of the detection signals. Therefore, the difference between both detection signals can be obtained by either adding together both detection signals or by subtracting one of the detection signals from the other of the detection signals.

The signal transmission device of the present invention has a pair of input terminals, a pair of output terminals, a pair of coils, a pair of magnetic sensors, and a signal output section.

An input signal is inputted into the pair of input terminals. The pair of output terminals is electrically insulated from the pair of input terminals. Each of the coils is connected between the pair of input terminals. Each of the coils generates a magnetic field respectively in response to the input signal that is applied between the pair of input terminals. The pair of coils is arranged such that a direction of the magnetic field generated by one of the coils is opposite to a direction of the magnetic field generated by the other of the coils. Each of the magnetic sensors corresponds to one of the coils exclusively. Each of the magnetic sensors is electrically insulated from the corresponding coil but is joined therewith magnetically. Each of the magnetic sensors detects the magnetic field generated by the corresponding coil. Each of the magnetic sensors outputs a detection signal in response to the detected magnetic field.

The signal output section outputs an output signal to the pair of output terminals. The output signal corresponds to a difference between the pair of detection signals outputted by the pair of magnetic sensors.

The pair of magnetic sensors may be selected from a group consisting of a pair of detection coils, a pair of hall elements and a pair of magnetic resistances (magnetoresistive elements).

In order to arrange the pair of coils such that the direction of the magnetic field generated by one of the coils is opposite to the direction of the magnetic field generated by the other of the coils, the pair of coils with same performance may, for example, be connected between the pair of input terminals in series or in parallel. Then, the pair of coils may be arranged so as to be opposite to each other, while keeping the axial directions of each coils in parallel. In other words, the pair of coils may be arranged in anti-series or in anti-parallel so that the directions of the axis lines of each coil are arranged in parallel.

Alternatively, if the winding direction of one of the coils is opposite to the other of the coils, it is still possible to realize an arrangement of the pair of coils such that the direction of the magnetic field generated by one of the coils is opposite to the direction of the magnetic field generated by the other of the coils. In this case, the pair of coils may be arranged such that the directions of axis lines thereof are kept in parallel, and the pair of coils may be connected in forward series or in forward parallel. With regard to this application, the definitions of "in forward series" and the like are as follows. Each of the coil windings has an input terminal and an output terminal. "In forward series" means that the output terminal of one of the coils is connected to the input terminal of the other coil in order to connect the pair of coils in series. "In anti-series" means that the output terminal of one of the coils is connected to the output terminal of the other coil in order to connect the pair of coils in series. "In forward parallel" means that the input terminal of one of the coils is connected to the input terminal of the other coil, and the output terminal of the former coil is connected to the output terminal of the latter coil in order to connect the pair of coils in parallel. "In anti-parallel" means that the input terminal of one of the coils is connected to the output terminal of the other coil, and the output terminal of the former coil is connected to the input terminal of the latter coil in order to connect the pair of coils in parallel. In this manner, the expressions "in forward series", "in anti-series", "in forward parallel" and "in anti-parallel" depend on the configuration of the two terminals of each coil winding. Therefore, in the present specification, "in series" means both "in forward series" and "in anti-series". Similarly, "in parallel" means both "in forward parallel" and "in anti-parallel". Furthermore, the terms "in anti-series" and the like can be applied not only to coils but also to other elements (hall elements, for example) that have two terminals (a ground terminal and a signal output terminal, for example) with different characteristics.

According to the signal transmission device described above, when the input signal is inputted between the pair of input terminals, the direction of the magnetic field generated by one of the coils is opposite to the direction of the magnetic field generated by the other of the coils. The magnetic field that is generated by each of the coils by means of the input signal is referred to as the "essential magnetic field". The direction of the essential magnetic fields generated by one of the coils is opposite to the direction of the essential magnetic field generated by the other of the coils. Therefore, the direction of the essential magnetic field acting on one of the magnetic sensors is opposite to the direction of the essential magnetic field acting on the other of the magnetic sensors.

On the other hand, an external noise magnetic field acts on the pair of magnetic sensors with a substantially uniform direction. Therefore, the direction of an external noise magnetic field acting on one of the magnetic sensors is the same as the direction of an external noise magnetic field acting on the other of the magnetic sensors.

Each of the magnetic sensors detects both the essential magnetic field and the external noise magnetic field, and outputs a detection signal in response to the detected magnetic fields. Therefore, in a case where the essential signal and the noise signal included in the detection signal of one of the magnetic sensors have same polarity, the essential signal and the noise signal included in the detection signal of the other of the magnetic sensors have opposite polarities.

The signal output section determines the difference between the detection signals of the pair of the magnetic sensors. By determining the difference between the detection signals on the basis of the relationship between the above-mentioned polarities, a signal in which the noise signal is canceled out and the level of the essential signal is doubled with respect to the level of the original essential signal, can be obtained. Therefore, the signal that is determined by signal output section is a signal which has a high S/N ratio. As a result, it is possible to realize a signal transmission device which reduces the influence of an external noise magnetic field and transmits a signal inputted to the pair of input terminals to the pair of output terminals without electrical connection between the pair of input terminals and the pair of output terminals.

The signal output section outputs an output signal in response to the difference between the detection signals. Preferably, the signal output section outputs an output signal that is proportional to the difference between the detection signals.

It should be noted that it is preferred that the detection signals outputted by the pair of magnetic sensors be reduced by half and inputted to the signal output section. By reducing the detection signals outputted by the pair of magnetic sensors by half, it is possible to obtain a signal which has same amplitude as the input signal and in which the ratio of the noise signal to the essential signal is reduced (i.e., the signal has a high S/N ratio).

In the signal transmission device of the present invention, the pair of magnetic sensors may be arranged so as to output the pair of detection signals having same polarity, when a direction of a magnetic field acting on one of the magnetic sensors is the same as a direction of a magnetic field acting on the other of the magnetic sensors. Such an arrangement is referred to as <arrangement A>. In <arrangement A>, the essential signals included in the detection signals of the magnetic sensors, which are caused by the essential magnetic fields, have opposite polarities. On the other hand, the noise signals included in the detection signals of the magnetic sensors, which are caused by an external noise magnetic field acting upon the pair of magnetic sensors in a uniform direction, have same polarity. In this case, therefore, the signal output section may be configured so as to subtract the detection signal of one of the magnetic sensors from the detection signal of the other of the magnetic sensors and thus output the subtraction result as the output signal. The output signal is a signal, in which the noise signal included in each of the detection signals is canceled and the level of the essential signal is doubled with respect to the level of the input signal.

It should be noted that the signal output section may use, for example, a differential amplifier to subtract the detection signal of one of the magnetic sensors from the detection signal of the other of the magnetic sensors.

On the contrary, the pair of magnetic sensors may also be arranged so as to output the pair of detection signals having opposite polarities, when a direction of a magnetic field acting on one of the magnetic sensors is the same as a direction of a magnetic field acting on the other of the magnetic sensors. Such an arrangement is referred to as <arrangement B>. In <arrangement B>, the essential signals in the pair of detection signals have same polarity. On the other hand, the noise signals in the pair of detection signals have opposite polarities. In this case, therefore, the signal output section may be configured so as to add together the pair of detection signals and outputs the result of the addition. In this case as well, the output signal is a signal in which the noise signal included in the detection signal of each of the pair of magnetic sensors is canceled out and the level of the essential signal is doubled with respect to the level of the input signal.

In <arrangement A> and in <arrangement B>, it is preferable that the pair of magnetic sensors may comprise a pair of hall elements. It is also preferable that the pair of magnetic sensors may comprise a pair of detection coils. In either case, it is possible to configure the signal output section that subtracts the detection signal of one of the magnetic sensors from the detection signal of the other of the magnetic sensors without the differential amplifier.

The hall element is an element that outputs voltage corresponding to a magnetic field acting there on. The voltage outputted by the hall element corresponds to the "detection signal outputted by the magnetic sensor".

In the case where <arrangement A> is utilized, the signal output section may comprise a parallel connection of the pair of hall elements. The pair of hall elements is connected in anti-parallel between the pair of output terminals. Furthermore, the signal output section may also comprise a series connection of the pair of hall elements. The pair of hall elements is connected anti-series between the pair of output terminals. In the case where <arrangement B> is utilized, the signal output section may comprise a series connection of the pair of hall elements. The pair of hall elements is connected in forward series between the pair of output terminals. Furthermore, the signal output section may also comprise a parallel connection of the pair of hall elements. The pair of hall elements is connected forward parallel between the pair of output terminals. In either case, the voltage corresponding to the difference between the output voltages of the pair of hall elements is outputted between the pair of output terminals.

When the pair of detection coils is used as the pair of magnetic sensors, each of detection coils (outside coils) and corresponding input side coil form a transformer.

In the case where <arrangement A> is utilized, the signal output section may comprise a series connection of the pair of detection coils. In this case, the pair of detection coils is connected in anti-series between the pair of output terminals. Furthermore, the signal output section may also comprise a parallel connection of the pair of detection coils. The pair of detection coils is connected anti-parallel between the pair of output terminals. In the case where <arrangement B> is utilized, the signal output section may comprise a parallel connection of the pair of detection coils. In this case, the pair of detection coils is connected in forward series or in forward parallel between the pair of output terminals. In either case, the current that corresponds to the difference between the induced currents of the pair of detection coils is outputted between the pair of output terminals.

It should be noted that connecting the pair of magnetic sensors in forward series or in forward parallel is the same as adding together the detection signals of the pair of magnetic sensors. Moreover, connecting the pair of magnetic sensors in anti-series or in anti-parallel is the same thing as subtracting the detection signal of one of the magnetic sensors from the detection signal of the other of the magnetic sensors. Both cases are identical to obtaining the difference between the detection signals of the pair of magnetic sensors.

As described above, the connections "in forward series", "in anti-series" and the like are configured based on the two output terminals that each of the magnetic sensors has. Therefore, depending on the configuration of the output terminals of each magnetic sensor, the expression, "in forward series", may be more appropriate than the expression, "in anti-series". Therefore, in the claims, the expression, "in series", is simply used to mean both "in forward series" and "in anti-series". Similarly, in the claims, the expression, "in parallel", is simply used to mean both "in forward parallel" and "in anti-parallel".

As described above, the present invention can realize a signal transmission device which effectively reduces the influence of an external noise magnetic field when transmitting a signal from the pair of input terminals to the pair of output terminals that are electrically insulated from the input terminals.

DESCRIPTION OF THE PREFERRED EMBODIMENTS

The technical features of the signal transmission device according to the embodiments are described hereinafter.

A conductive member for surrounding a pair of input side coils and a pair of magnetic sensors is provided. The conductive member can reduce the influence of noise magnetic fields acting on the pair of coils and the pair of magnetic sensors.

The pair of input side coils and output side coils that are magnetically joined with the input side coils respectively are formed on a semiconductor substrate. These coils can be formed on the semiconductor substrate by means of a semiconductor processing technology such as an etching or a processing of metallic film evaporation. Accordingly, a compact signal transmission device can be realized.

First Embodiment

Figure 1:
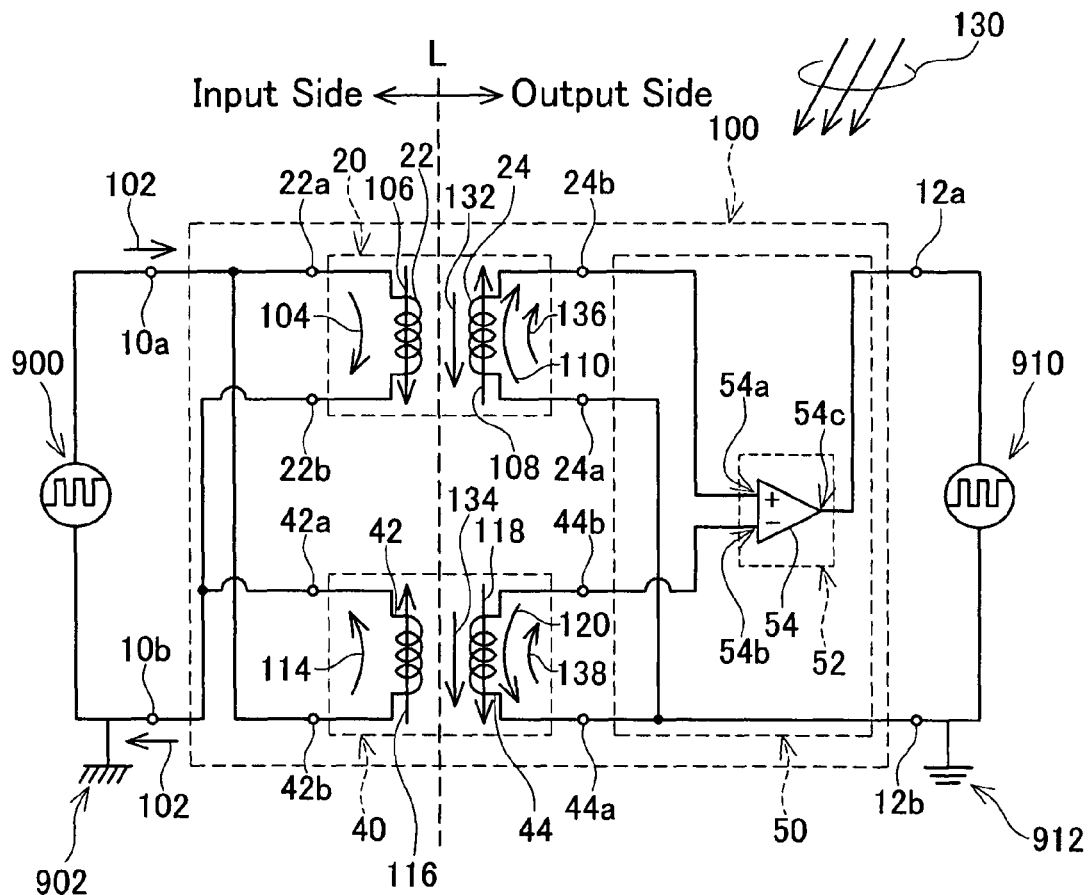
FIG. 1 is an entire circuit diagram of a signal transmission device of a first embodiment.

The signal transmission device of the first embodiment of the present invention is described with reference to the drawings. FIG. 1 is a circuit diagram of a signal transmission device 100 according to the first embodiment. The signal transmission device 100 has a pair of input terminals 10a, 10b, a pair of output terminals 12a, 12b, a pair of coils (a first input side coil 22, a second input side coil 42), a pair of detection coils (a first output side coil 24, a second output side coil 44), and a signal output section 50.

An external first circuit 900 can be connected between the pair of input terminals 10a, 10b. In the signal transmission device 100, the input side coils 22, 42 are connected between the pair of input terminals 10*a*, 10*b*.

An external second circuit 910 can be connected between the pair of output terminals 12*a*, 12*b*.

A first transformer 20 is formed by the first input side coil 22 and the first output side coil 24. Similarly, a second transformer 40 is formed by the second input side coil 42 and the second output side coil 44. The first input side coil 22 and the first output side coil 24 are insulated from each other electrically but are joined with each other magnetically. Similarly, the second input side coil 42 and the second output side coil 44 are insulated from each other electrically but are joined with each other magnetically. "Joined with each other magnetically" means that each output side coil generates induced currents in response to the magnetic fields generated by the input side coil corresponding to the output side coil.

The circuit in the signal transmission device 100 is electrically insulated between the first input side coil 22 and the first output side coil 24 and between the second input side coil 42 and the second output side coil 44. Namely, the circuit in the signal transmission device 100 is electrically insulated at the broken line L in FIG. 1. The left side of the dashed line L in the figure is referred to as "input side", while the right side of the dashed line L in the figure is referred to as "output side".

This signal transmission device 100 is a device that transmits an electric signal (an input signal), which is outputted from the first circuit 900, to the second circuit 910 without electric connection. A ground of the first circuit 900 is shown with a reference numeral 902, and a ground of the second circuit 910 is shown with a reference numeral 912. In order to show that the first circuit 900 and the second circuit 910 are not connected with each other electrically, the ground 902 of the first circuit 900 and the ground 912 of the second circuit 910 are illustrated in different symbols.

First, outlines of the circuits of the signal transmission device 100 are described.

Input signals that are applied from the first circuit 900 to the input terminals 10*a*, 10*b* are transmitted from the input side to the output side through the first transformer 20 and the second transformer 40. The first transformer 20 and the second transformer 40 transmit the input signals from the input side to the output side by the electromagnetic effect.

The signal transmission device 100 can eliminate the influence of an external magnetic field (referred to as "external noise magnetic field" or simply "noise magnetic field" hereinafter) acting on the signal transmission device 100 while transmitting the signal though the first transformer 20 and the second transformer 40 by the electromagnetic inductive effects. The principle for eliminating the influence of the external noise magnetic field will be described later.

The components of the signal transmission device 100 are described.

The first transformer 20 and the second transformer 40 have the same structure and the same performance.

One end of the first input side coil 22 is referred to as "first input side coil input end 22*a*" and the other end is referred to as "first input side coil output end 22*b*". One end of the first output side coil 24 is refereed to as "first output side coil input end 24*a*" and the other end is referred to as "first output side coil output end 24*b*".

Similarly, one end of the second input side coil 42 is referred to as "second input side coil input end 42*a*" and the other end is referred to as "second input side coil output end 42*b*". One end of the second output side coil 44 is referred to as "second output side coil input end 44*a*" and the other end is referred to as "second output side coil output end 44*b*". Each input end and each output end of each of these coils are named as above in order to define the directional properties of the coils. Each of the transformers is configured such that when currents increase in the direction from the input end of the input side coil to the output end of the same, inducted currents increase in the direction from the input end of the output side coil to the output end of the same.

For simplification, the first input side coil input end 22*a* is simply referred to as "input end 22*a*" hereinafter. Similarly, the first input side coil output end 22*b* is simply referred to as "output end 22*b*". The input end and the output end of the first output side coil 24, the second input side coil 42, and the second output side coil 44 are similarly simplified.

The first input side coil 22 and the second input side coil 42 are arranged and connected such that when an input signal is applied between the pair of input terminals 10*a*, 10*b*, magnetic fields that are spatially in opposite directions are generated. The specific arrangements and connections are described hereinafter.

The first input side coil 22 and the second input side coil 42 are arranged in the same direction in space. "Same direction in space" means that the axial direction of the first input side coil 22 and the axial direction of the second input side coil 42 are arranged in parallel. "Axial direction of the coil" means the direction that passes through the center of the winding of the coil and is perpendicular to a cross section of the coil. At this moment, the pair of coils is arranged so that the positional relationship between the input end and output end of one coil is the same as the one of the other coil. As shown in FIG. 1, when the input end 22*a* of the first input side coil 22 is positioned above the output end 22*b* in the figure, the input end 42*a* of the second input side coil 42 is also positioned above the output end 42*b* in the figure.

With the arrangement of the first input side coil 22 and the second input side coil 42 in the manner described above, the first input side coil 22 and the second input side coil 42 are connected in anti-parallel between the pair of input terminals 10*a*, 10*b*. The first input side coil 22 and the second input side coil 42 are connected in a manner described hereinafter. The input end 22*a* of the first input side coil 22 and the output end 42*b* of the second input side coil 42 are both connected to one of the input terminals, 10*a*. The output end 22*b* of the first input side coil 22 and the input end 42*a* of the second input side coil 42 are both connected to the other input terminal 10*b*.

Because of the above-described arrangements and connections, when the input signals are applied to the pair of input terminals 10*a*, 10*b*, one of the coils generates a magnetic field in a direction opposing a direction of the magnetic field generated by the other coil. As shown in FIG. 1, when the current in the input signal increases in the directions of the arrows 102, the current flowing into the first input side coil 22 increases in the direction of the arrow 104 while the current flowing into the second input side coil 42 increases in the direction of the arrow 114. The increasing direction of the current in the first input side coil 22 is opposed to the increasing direction of the current in the second input side coil 42. In the first input side coil 22, a magnetic field that increases in the direction of the arrow 106 is generated by the current that increases in the direction of the arrow 104. At the same time, in the second input side coil 42, a magnetic field that increases in the direction of the arrow 116 is generated by the current that increases in the direction of the arrow 114. The direction shown by the arrow 106 is opposite to the direction shown by the arrow 116. Namely, the direction of the magnetic field generated by the first input side coil 22 is opposite to the direction of the magnetic field generated by the second input side coil 42.

It should be noted that the arrows 102 showing the directions of the input signals are sometimes referred to as "input signals 102" hereinafter. Similarly, the arrow 106 showing the direction of the magnetic field is sometimes referred to as "magnetic field 106". The same applies to the other arrows.

The output side coil of each of the transformers 20, 40 is described next. It should be noted in the present specification that the induced current outputted by the first output side coil 24 of the first transformer 20 and the induced current that is outputted by the second output side coil 44 of the second transformer 40 are each referred to as "detection signal".

The spatial positional relationship between the first output side coil 24 and the second output side coil 44 is the same as the spatial positional relationship between the first input side coil 22 and the second input side coil 42. Namely, the axial direction of the first output side coil 24 and the axial direction of the second output side coil 44 are arranged in parallel. At this moment, the input ends and the output ends of both output side coils are arranged to have the same positional relationship. As shown in FIG. 1, when the input end 24a of the first output side coil 24 is positioned below the output end 24b in the figure, the input end 44a of the second output side coil 44 is also positioned below the output end 44b in the figure.

The ratio between the number of windings of the first input side coil 22 and the number of windings of the first output side coil 24 in the first transformer 20 is 1:1. Therefore, the first transformer 20 transmits the input signal, which is applied to the first input side coil 22, to the first output side coil 24 without changing the amplitude of the input signal. The ratio between the number of windings of the second input side coil 42 and the number of windings of the second output side coil 44 in the second transformer 40 is also 1:1. The second transformer 40 also transmits the input signal, which is applied to the second input side coil 42, to the second output side coil 44 without changing the amplitude of the input signal. It should be noted that the present embodiment is described without considering the internal resistances of the transformers, electrical loss, and a phase lag between the input signal applied to each input side coil and the detection signal outputted from each output side coil.

As described above, when the input signal that increases in the direction from the input end 22a to the output end 22b of the first input side coil 22 flows as shown by the arrow 104 in FIG. 1, the induced current (the detection signal) that increases in the direction from the input end 24a to the output end 24b of the first output side coil 24, as shown by the arrow 110, is generated. At the same time, when the input signal that increases in the direction from the output end 42b to the input end 42a of the second input side coil 42 flows as shown by the arrow 114 in FIG. 1, the induced current (the detection signal) that increases in the direction from the output end 44b to the input end 44a of the second output side coil 44, as shown by the arrow 120, is generated.

The signal output section 50 is connected to the input end 24a and output end 24b of the first output side coil 24, and to the input end 44a and output end 44b of the second output side coil 44. The signal output section 50 is further connected to the pair of output terminal 12a, 12b of the signal transmission device 100. The signal output section 50 has a differential circuit 52 having a differential amplifier 54. The differential circuit 52 has a resistance and the like other than the differential amplifier 54, but illustration of these components in FIG. 1 is omitted. A detailed configuration of the differential circuit 52 will be described later.

In the signal output section 50, the input end 24a of the first output side coil 24 and the input end 44a of the second output side coil 44 are both connected to the output terminal 12b.

The output end 24b of the first output side coil 24 is connected to a noninverting input end 54a of the differential amplifier 54. The output end 44b of the second output side coil 44 is connected to an inverting input end 54b of the differential amplifier 54. An output end 54c of the differential amplifier 54 is connected to the output terminal 12a. In other words, the signal output section 50 connects the pair of output side coils 24, 44 in parallel between the output terminal 12b and the differential amplifier 54, and further connects the output end of the differential amplifier 54 to the other output terminal 12a.

The induced currents (i.e., the detection currents) generated by the first output side coil 24 and the second output side coil 44 are inputted to the signal output section 50. The signal output section 50 outputs output signals to the pair of output terminals 12a, 12b.

The external second circuit 910 is connected to the pair of output terminals 12a, 12b. The output terminal 12b is connected to the ground 912 of the external second circuit 910. The output terminal 12b is connected to the input end 24a of the first output side coil 24 and the input end 44a of the second output side coil 44 in the signal output section 50. Therefore, the input end 24a of the first output side coil 24 and the input end 44a of the second output side coil 44 are connected to the ground 912 of the external second circuit 910.

Figure 2:
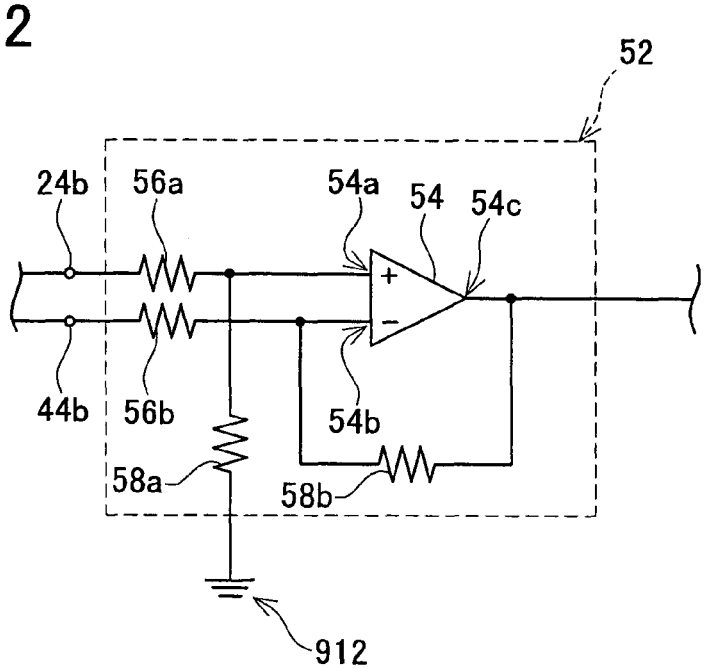
FIG. 2 is a circuit diagram of a differential circuit of the first embodiment.

The differential circuit 52 is described in detail with reference to FIG. 2.

The output end 24b of the first output side coil 24 and the noninverting input end 54a of the differential amplifier 54 are connected with each other via a resistance 56a. The output end 44b of the second output side coil 44 and the inverting input end 54b of the differential amplifier 54 are connected with each other via a resistance 56b. The ground 912 of the second circuit 910 is connected between noninverting input end 54a of the differential amplifier 54 and the resistance 56a, via a resistance 58a. The output end 54c of the differential amplifier 54 is connected between the inverting input end 54b of the differential amplifier 54 and the resistance 56b via a resistance 58b. The resistances 56a and 56b have the same resistance value. Moreover, the resistances 58a and 58b have the same resistance value. The resistances 56a, 56b, 58a and 58b are provided in order to operate the differential amplifier 54 stably.

Next, the principle for eliminating the influence of the noise magnetic field generated by the external equipment while transmitting the input signals from the external first circuit 900 to the external second circuit 910 will be described.

When the input signals are applied, the first input side coil 22 and the second input side coil 42 generate magnetic fields which are spatially in opposite directions. It is assumed that the input signals are the currents that increase in the directions of the arrows 102. At this moment, the current flowing in the first input side coil 22 increases in the direction shown by the arrow 104. In other words, the current in the first input side coil 22 increases in the direction from the input end 22a to the output end 22b. The first input side coil 22 generates a magnetic field that increases in the direction shown by the arrow 106. The first output side coil 24 generates the induced current so as to generate a magnetic field that cancels out the magnetic field generated by the first input side coil 22. The direction of the magnetic field generated by the induced current in the first output side coil 24 is shown by the arrow 108. This induced current (i.e., the detection signal) becomes a signal that increases in the direction from the input end 24a to the output end 24b of the first output side coil 24 as shown by the arrow 110.

On the other hand, the current flowing in the second input side coil 42 increases in the direction shown by the arrow 114. In other words, the current increases in the direction from the output end 42*b* to the input end 42*a*. The second input side coil 42 generates a magnetic field that increases in the direction shown by the arrow 116. The second output side coil 44 generated the induced current so as to generate a magnetic field that cancels out the magnetic field generated by the second input side coil 42. The direction of the magnetic field generated by the induced current in the second output side coil 44 is shown by the arrow 118. This induced current (i.e., the detection signal) becomes a signal that increases in the direction from the output end 44*b* to the input end 44*a* of the second output side coil 44, as shown by the arrow 120.

The input end 24*a* of the first output side coil 24 and the input end 44*a* of the second output side coil 44 are both connected to the ground 912 of the external second circuit 910. Therefore, the detection signal that is outputted by the first output side coil 24 can be expressed in the level of the signal at the output end 24*b*, with respect to the ground 912. Similarly, the detection signal that is outputted by the second output side coil 44 can be expressed in the level of the signal at the output end 44*b*, with respect to the ground 912.

It is assumed that the ground 912 is the reference of signal levels. Since the detection signal outputted from the first output side coil 24 flows in the direction shown by the arrow 110, the level of the detection signal of the first output side coil 24 is positive. On the other hand, since the detection signal outputted from the second output side coil 44 flows in the direction shown by the arrow 120, the level of the detection signal of the second output side coil 44 is negative. Namely, the detection signal outputted by the first output side coil 24 and the detection signal outputted by the second output side coil 44 have opposite polarities with respect to the input signal 102. The term "opposite polarities" means as follows. When the level of the detection signal of one of the magnetic sensors increases, the level of the detection signal of the other magnetic sensor decreases.

Here, the influences of the noise magnetic field acting on the signal transmission device 100 are considered. When the noise magnetic field acts on the pair of output side coils 24, 44, each of the output side coils also outputs a detection signal in response to the noise magnetic field. Hereinafter, the component of the detection signal caused by the noise magnetic field is referred to as "the noise signal". On the other hand, the detection signal caused by the magnetic field generated by the input side coil is referred to as "the essential signal". The detection signal that is outputted by each of the output side coils includes the noise signal and the essential signal.

The noise magnetic fields uniformly act on the signal transmission device 100 (i.e., the pair of output side coils 24, 44). It is assumed that the noise magnetic fields increase in the directions shown by the arrows 130. The component of the noise magnetic fields 130 affecting on the detection signal of the first output side coil 24 is shown by the arrow 132. The component of the noise magnetic field 130 affecting on the detection signal of the second output side coil 44 is shown by the arrow 134. Since the noise magnetic fields 130 act on the signal transmission device 100 substantially uniformly, the directions of the arrows 132, 134 and the magnitudes of the arrows 132, 134 are the same.

When the noise magnetic field component increases in the direction shown by the arrow 132, the first output side coil 24 generates the induced current so as to generate a magnetic field that cancels out the noise magnetic field component. The direction of the noise magnetic field component 132 is the same as the direction of the magnetic field 106 generated by that first input side coil 22. Therefore, the noise signal 136 outputted by the first output side coil 24 due to the noise magnetic field component 132, and the essential signal 110 outputted by the first output side coil 24 due to the magnetic field 106 generated by the first input side coil 22, have the same polarity.

On the other hand, when the noise magnetic field component increases in the direction shown by the arrow 134, the second output side coil 44 generates the induced current so as to generate a magnetic field that cancels out the noise magnetic field component. The direction of the noise magnetic field component 134 is opposite to the direction of the magnetic field 116 generated by that second input side coil 42. Therefore, the noise signal 138 outputted by the second output side coil 44 due to the noise magnetic field component 134, and the essential signal 120 outputted by the second output side coil 44 due to the magnetic field 116 generated by the second input side coil 42, have opposite polarities.

Moreover, since the first output side coil 24 and the second output side coil 44 are arranged in the same direction, the direction of the noise magnetic field component 132 acting on the first output side coil 24 is the same as the direction of the noise magnetic field component 134 acting on the second output side coil 44. Therefore, the noise signal 136 that is outputted from the output end 24*b* of the first output side coil 24 and the noise signal 138 that is outputted from the output end 44*b* of the second output side coil 44 have the same polarity. "Same polarity" means as follows. When the detection signal of one of the magnetic sensors (output side coils) increases, the detection signal of the other magnetic sensor also increases.

The above explanation assumes the case where the input signals increase, in FIG. 1, in the directions of the arrows 102 and the case where the direction of the magnetic field generated by the first input side coil 22 is the same as the directions of the noise magnetic fields. The abovementioned relationship of polarities of the detection signals are held regardless of the directions of the input signals or the directions of the noise magnetic fields. The polarity of the essential signal that is included in the detection signal outputted by the first output side coil 24 is opposite to the polarity of the essential signal that is included in the detection signal outputted by the second output side coil 44. At the same time, the polarity of the noise signal that is included in the detection signal outputted by the first output side coil 24 is the same as the polarity of the noise signal that is included in the detection signal outputted by the second output side coil 44. The same noise magnetic field 130 acts on the pair of output side coils 24, 44. Therefore, arrangement of the pair of output side coils 24, 44 can be expressed as follows. The pair of output side coils are arranged such that, when the direction of the magnetic field acting on one of the output side coils is the same as the direction of the magnetic field acting on the other output side coil, the polarity of the detection signal of the former output side coil is the same as the polarity of the detection signal of the latter output side coil.

The output end 24*b* of the first output side coil 24 is connected to the noninverting input end 54*a* of the differential amplifier 54 in the signal output section 50. The output end 44*b* of the second output side coil 44 is connected to the inverting input end 54*b* of the differential amplifier 54.

Figure 3:
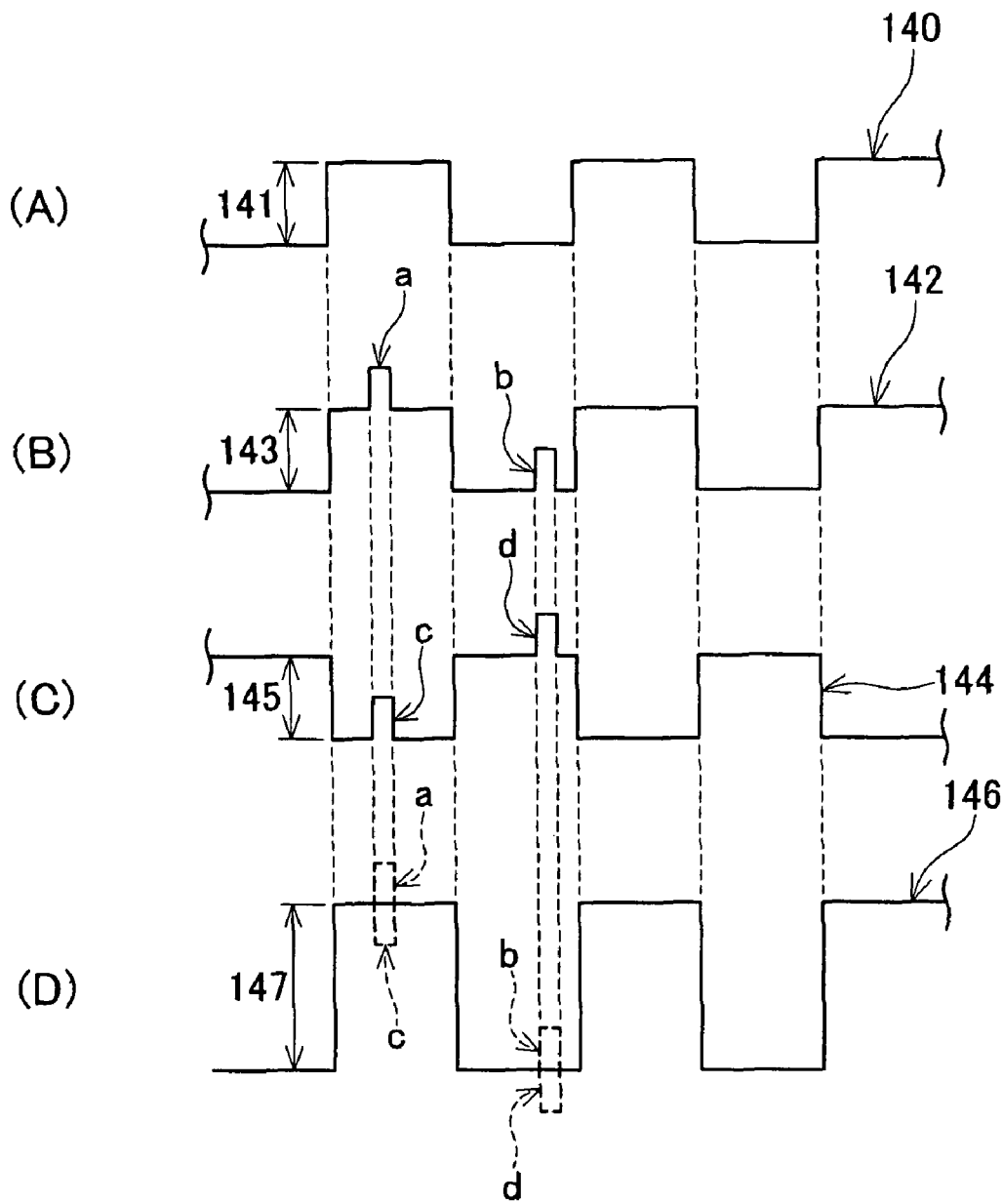
FIG. 3A is a schematic time chart of an input signal that is inputted by the signal transmission device of the first embodiment.
FIG. 3B is a schematic time chart of a detection signal that is outputted by a first output side coil.
FIG. 3C is a schematic time chart of a detection signal that is outputted by a second output side coil.
FIG. 3D is a schematic time chart of an output signal that is outputted by a differential amplifier.

FIG. 3 shows a schematic time chart of an input signal, a detection signal outputted from the output end 24*b* of the first output side coil 24, a detection signal outputted from the output end 44*b* of the second output side coil 44, and an output signal of the differential amplifier 54. FIG. 3A shows a waveform of an input signal 140. FIG. 3B shows a waveform of a detection signal 142 outputted from the output end 24b of the first output side coil 24. FIG. 3C shows a waveform of a detection signal 144 outputted from the output end 44b of the second output side coil 44. FIG. 3D shows a waveform of an output signal 146 outputted from the output end 54c of the differential amplifier 54. The amplitude of the input signal 140 is shown with a reference numeral 141. The amplitude of the detection signal 142 is shown with a reference numeral 143. The amplitude of the detection signal 144 is shown with a reference numeral 145. The amplitude of the output signal 146 is shown with a reference numeral 147. Each of the broken lines vertically connecting FIG. 3A through FIG. 3D indicates the same timing for all signals.

The waveform of the detection signal 142 outputted from the output end 24b of the first output side coil 24 (FIG. 3B) has the same polarity as the waveform of the input signal 140 (FIG. 3A). The amplitude 143 of the detection signal 142 is the same as the amplitude 141 of the input signal 140. Noise signal components (a), (b) are added to the detection signal 142. The parts other than the noise signal components (a), (b) in the detection signal 142 are the essential signals.

The polarity of the waveform of the detection signal 144 outputted from the output end 44b of the second output side coil 44 (FIG. 3C) is opposite to the polarity of the waveform of the detection signal 142 of the first input side coil 22 (FIG. 3B). The amplitude 145 of the detection signal 144 is the same as the amplitude 141 of the input signal 140. Noise signal components (c), (d) are added to the detection signal 144. The parts other than the noise signal components (c), (d) in the detection signal 144 are the essential signals.

As described above, the noise signal component (a) that is outputted from the output end 24b of the first output side coil 24 and the noise signal component (c) that is outputted from the output end 44b of the second output side coil 44 have the same polarity. Since the noise signal components (a) and (c) are caused by the noise magnetic field, the noise signal components (a) and (c) are occurred at the same time. Similarly, the noise signal component (b) and the noise signal component (d) have the same polarity and are occurred at the same time.

On the other hand, the polarity of the essential signal that is included in the detection signal outputted by the first output side coil 24 (the waveforms other than the noise signal components (a) and (b) in the waveform 142 of the detection signal shown in FIG. 3B) is opposite to the polarity of the essential signal included in the detection signal outputted by the second output side coil 44 (the waveforms other than the noise signal components (c) and (d) in the waveform 144 of the detection signal shown in FIG. 3C).

The differential amplifier 54 shown in FIG. 1 outputs a difference between the detection signal outputted from the output end 24b of the first output side coil 24 (the detection signal 142 shown in FIG. 3B) and the detection signal outputted from the output end 44b of the second output side coil 44 (the detection signal 144 shown in FIG. 3C). The result of this difference is the waveform of the output signal 146 shown in FIG. 3D. As shown in FIG. 3D, the essential signal included in the detection signal 142 and the essential signal included in the detection signal 144 are added together. The output signal 146 has the amplitude 147. The amplitude 147 is twice as large as the amplitude 141 of the input signal 140.

On the other hand, the noise signal component (a) included in the detection signal 142 and the noise signal component (c) included in the detection signal 144 are synchronized and have the same polarity. Therefore, the difference between the noise signal components (a) and (c) is obtained by the differential amplifier 54, whereby the noise signal components (a) and (c) are offset. Similarly, the noise signal component (b) included in the detection signal 142 and the noise signal component (d) included in the detection signal 144 also are synchronized and have the same polarity. Therefore, the difference between the noise signal components (b) and (d) is obtained by the differential amplifier 54, whereby the noise signal components (b) and (d) are offset. As a result, as shown in FIG. 3D, the output signal 146 of the differential amplifier 54 becomes a signal in which the noise signal components are removed and the amplitude of the input signal is doubled up.

As described above, in the signal transmission device 100 of the present embodiment, the input signal that is inputted between the pair of input terminal 10a, 10b from the external first circuit 900 is transmitted to the external second circuit 910 via the pair of transformers 20, 40 in an electrically insulated state of the device. The first transformer 20 is formed by the first input side coil 22 and the first output side coil 24 that is electrically insulated from the input side coil 22 but joined therewith magnetically. The second transformer 40 is formed by the second input side coil 42 and the second output side coil 44 that is electrically insulated from the input side coil 42 but joined therewith magnetically.

The first input side coil 22 and the second input side coil 42 are arranged such that when the input signal is applied, one of the coils generates a magnetic field in a direction opposing a direction of the magnetic field generated by the other coil. In each of the transformers, induced current (i.e. detection signals) corresponding to the magnetic field generated by each input side coil is outputted from the output side coil.

The noise magnetic field acts on both output side coils 24, 44 substantially uniformly. In the case where the direction of the magnetic field generated by the first input side coil 22 and the direction of the noise magnetic field is the same, the direction of the magnetic field generated by the second input side coil 42 is opposite to the direction of the noise magnetic field. On the other hand, in the case where the direction of the magnetic field generated by the first input side coil 22 is opposite to the direction of the noise magnetic field, the direction of the magnetic field generated by the second input side coil 42 is the same as the direction of the noise magnetic field.

In the case where the noise magnetic field is detected, each of the output side coils outputs a detection signal in response to the noise magnetic field. The detection signal outputted by each of the output side coils includes the signal (the essential signal) that is caused by the magnetic field generated by the input side coil and the signal (the noise signal) that is caused by the noise magnetic field.

The coils of the pair of output side coils 24, 44 are arranged such that the detection signals outputted from the output side coils have the same polarity when a uniform magnetic field acts on the pair of output side coils 24, 44.

In the case where the input signal is applied between the pair of input terminals under the presence of the noise magnetic field, the relationship between the polarities of the essential signal and noise signal included in the detection signal of the first output side coil 24 is opposite to the relationship between the polarities of the essential signal and noise signal included in the detection signal of the second output side coil 44. Therefore, the signal corresponding to the difference between the detection signals outputted from the pair of output side coils 24, 44 is a signal with adding together the essential signals included in the detection signals and offsetting the noise signals included in the detection signals.

In the signal transmission device 100 of the present embodiment, the input signal that is inputted between the pair of input terminals is transmitted via the pair of input side coils and the pair of output side coils that are electrically insulated from the input side coils but joined with the input side coils magnetically. The output side coils output the detection signals corresponding to the input signal. The signal transmission device 100 outputs a signal (an output signal) corresponding to the difference between the detection signals outputted by the output side coils. The pair of input side coils are arranged such that the directions of the magnetic fields generated due to the input signal are opposite with each other. The detection signals outputted from the pair of output side coils due to the input signal have polarities that are opposite with each other. In other words, the pair of output side coils are arranged such that when the direction of the magnetic field acting on one of the output side coils is opposite to the direction of the magnetic field acting on the other output side coil, the polarity of the detection signal of the former output side coil is opposite to the polarity of the detection signal of the latter output side coil. Such arrangement is the same as the one described hereinafter. The pair of output side coils are arranged such that when the direction of the magnetic field acting on one of the output side coils is the same as the direction of the magnetic field acting on the other output side coil, the polarity of the detection signal of the former output side coil is the same as the polarity of the detection signal of the latter output side coil. The signal output section 50 of the signal transmission device 100 outputs a signal (an output signal) corresponding to the difference between the detection signals outputted by the output side coils (each detection signal has the essential signal and the noise signal). According to such a configuration, the signal transmission device 100 can output a signal (an output signal) with doubling up the amplitude of the input signal and offsetting the noise signal. The signal transmission device 100 can transmit a signal with high S/N ratio from the pair of input terminals to the pair of output terminals that are electrically insulated from the input terminals.

The signal transmission device 100 of the present embodiment is characterized in transmitting the input signal in two channels by means of the pair of transformers. The pair of transformers are arranged so as to have a relation in which the polarities of the essential signal and the noise signal in one of the channels is opposite to the polarities of the essential signal and the noise signal in the other channel. Accordingly, by taking the difference between the outputs of the both channels (outputs of the pair of transformers), a signal with doubling up the amplitude of the essential signal and offsetting the noise signal can be outputted.

It should be noted that the schematic time chart of each signal shown in FIG. 3 shows rectangular waves on the basis of the input signal and the noise signal. The shape of the input signal is not limited to the rectangular waveform. The input signal may be in the form of, for example, a sine wave. Moreover, the frequency of the input signal may change with time. The shape of the noise signal also is not limited to the rectangular waveform. The noise signal corresponds to the change of the noise magnetic field. With any kind of magnetic fields that act uniformly on the pair of output side coils 24, 44, the noise signal that is included in the detection signal outputted from the first output side coil 24 and the noise signal that is included in the detection signal outputted from the second output side coil 44 have the same polarity and are synchronized. Therefore, the noise signal can be offset by obtaining the difference between the detection signal of the first output side coil 24 of the first transformer 20 and the detection signal of the second output side coil 44 of the second transformer 40.

In the signal transmission device 100 described above, the amplitude 147 of the output signal 146 shown in FIG. 3D is twice as large as the amplitude 141 of the input signal 140 shown in FIG. 3A. By appropriately adjusting the output circuit, the amplitude of the output signal can be made substantially the same as the amplitude of the input signal 140. This adjustment can be realized by adjusting the size of the resistances 56a, 56b (see FIG. 2) that are arranged in the differential circuit 52, so that the amplitude of the detection signal inputted to the difference amplifier 54 becomes half of the amplitude of the input signal. In this case, the amplitude of the noise signal that is included in the detection signal inputted to the differential amplifier 54 becomes half the amplitude of the noise signal that is included in the detection signal which does not yet passes through the resistances 56a, 56b. Therefore, the amplitude of the output signal of the differential amplifier 54 is doubled up with respect to the amplitudes of the magnetic fields. In this case as well, the signal transmission device 100 can improve the S/N ratio when transmitting the input signal, as described with reference to FIG. 3.

Second Embodiment

Figure 4:
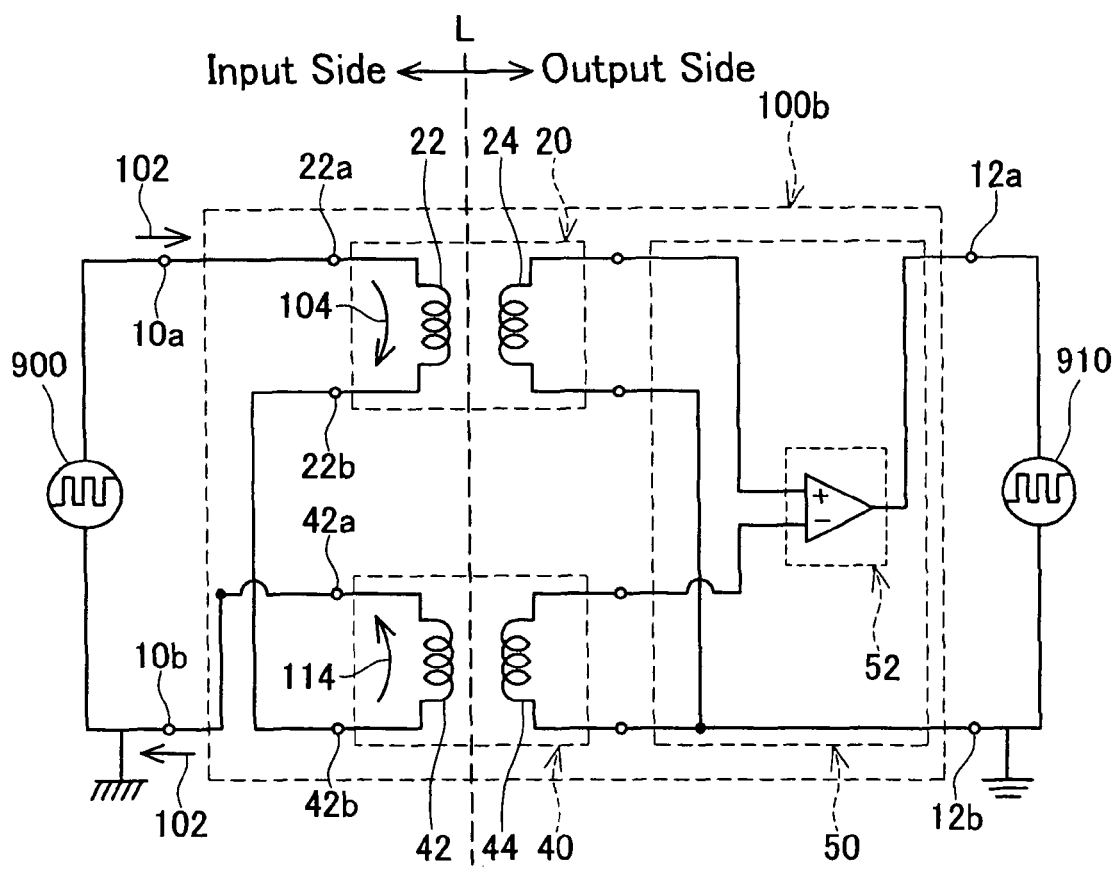
FIG. 4 is a circuit diagram of a signal transmission device of a second embodiment.

The second embodiment will be described. FIG. 4 shows a circuit diagram of a signal transmission device 100b according to the second embodiment. The signal transmission device 100b has the first transformer 20, second transformer 40 and signal output section 50. As with the signal transmission device 100 shown in FIG. 1, the first transformer 20 is formed by the first input side coil 22 and the first output side coil 24. The second transformer 40 is formed by the second input side coil 42 and the second output side coil 44.

The configuration on the right side of the broken line L in FIG. 4 (output side) is the same as the configuration on the output side of the signal transmission device 100 shown in FIG. 1. Therefore, in FIG. 4, the reference numerals for some components that are the same as those of the signal transmission device 100 of the first embodiment are omitted.

In the signal transmission device 100 shown in FIG. 1, the first input side coil 22 and the second input side coil 42 are connected in anti-parallel between the pair of input terminals 10a, 10b. On the contrary, in the signal transmission device 100b of the present embodiment, the first input side coil 22 and the second input side coil 42 are connected in anti-series between the pair of input terminals 10a, 10b. "In anti-series" can be expressed as follows by using the terms, "the input end" and "the output end" of each of the coils, which are defined in the explanation of the first embodiment. Namely, the term, "in anti-series", means that the output end of one of the input side coils and the output end of the other input side coil are connected with each other. In FIG. 4, the input terminal 10a is connected to the input end 22a of the first input side coil 22. The output end 22b of the first input side coil 22 is connected to the output end 42b of the second input side coil 42. The input end 42a of the second input side coil 42 is connected to the other input terminal 10b. By such connections, the pair of input side coils can be arranged such that the direction of the magnetic field generated by one of the input side coils is opposite to the direction of the magnetic field generated by the other input side coil. For example, when the input signal inputted from the external first circuit 900 increases in the direction of the arrow 102, the input signal flowing into the first input side coil 22 increases in the direction of the arrow 104 while the input signal flowing into the second input side coil 42 increases in the direction of the arrow 114. The directions of the arrows 104 and 114 shown in FIG. 4 are the same as the directions of the arrows 104 and 114 shown in FIG. 1. The signal transmission device 100b in which the pair of transformers are connected in anti-series between the pair of input terminals has the same function as the signal transmission device 100 described in FIG. 1, and thereby achieves the same effects.

Third Embodiment

Figure 5:
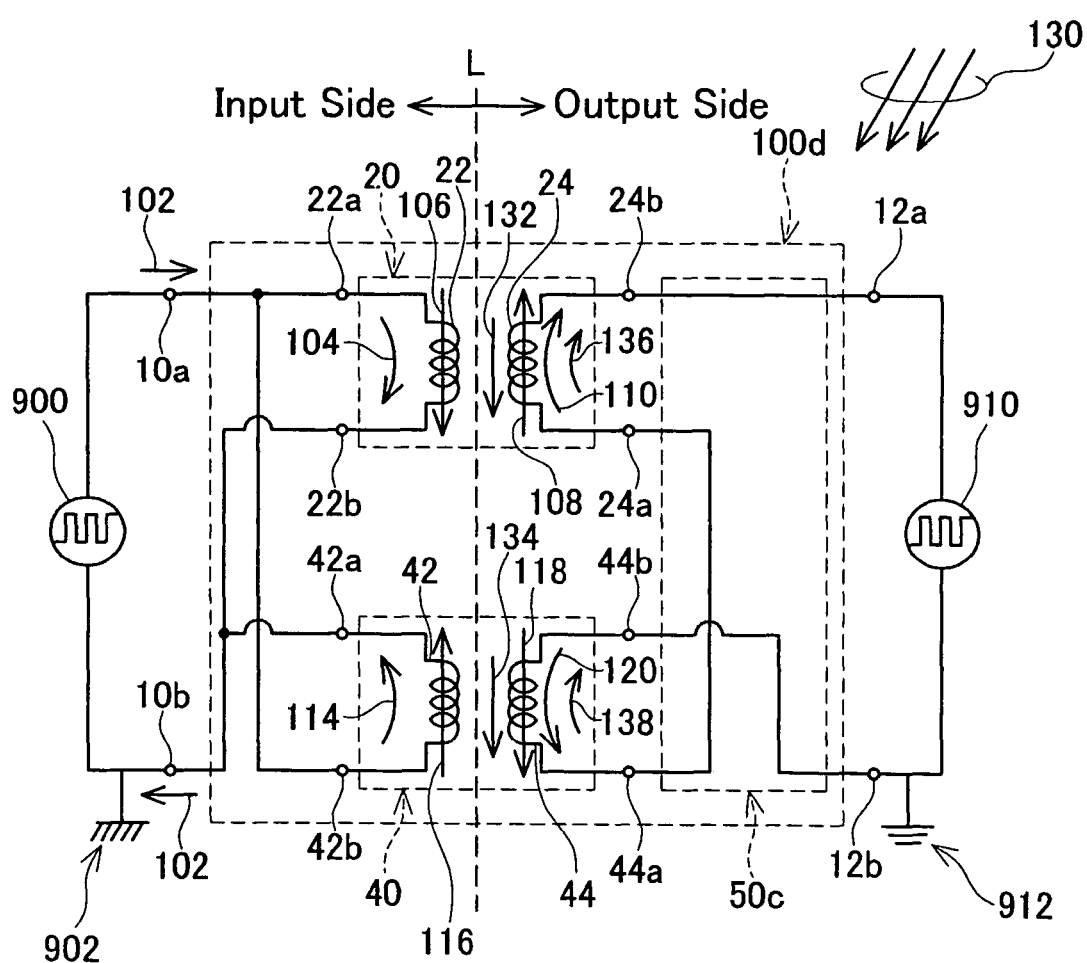
FIG. 5 is a circuit diagram of a signal transmission device of a third embodiment.

The third embodiment of the present invention will be described. FIG. 5 is a circuit diagram of a signal transmission device 100d according to the third embodiment. The signal transmission device 100d of the present embodiment has the pair of input terminals 10a, 10b, the pair of output terminals 12a, 12b, the pair of transformers (the first transformer 20, the second transformer 40), and a signal output section 50b. The first transformer 20 is formed by the first input side coil 22 and the first output side coil 24. The first output side coil 24 is electrically insulated from the input side coil 22 but joined therewith magnetically. The second transformer 40 is formed by the second input side coil 42 and the second output side coil 44. The second output side coil 44 is electrically insulated from the input side coil 42 but joined therewith magnetically.

In FIG. 5, the same components as those of the signal transmission device 100 shown in FIG. 1 are applied with the same reference numerals. Thus, the explanations of the components that are the same as those of the signal transmission device 100 are omitted. The difference between the signal transmission device 100d of the present embodiment and the signal transmission device 100 shown in FIG. 1 is the configuration of the signal output section 50c.

The arrangement of the first transformer 20 (i.e., the first input side coil 22 and the first output side coil 24) and the second transformer 40 (i.e., the second input side coil 42 and the second output side coil 44) are the same as those of the signal transmission device 100 shown in FIG. 1. Moreover, the connection relationships between input end 22a of the first input side coil 22, the input end 42a of the second input side coil 42, and the pair of input terminals 10a and 10b are the same as those of the signal transmission device 100 shown in FIG. 1. Therefore, in the signal transmission device 100d shown in FIG. 5 as well, the direction 106 of the magnetic field generated by the input side coil 22 due to the input signal 102 inputted from the external first circuit 900 is spatially opposite to the direction 116 of the magnetic field generated by the second input side coil 42.

Moreover, the directions of the arrows shown in FIG. 5 are the same as the directions of the arrows shown in FIG. 1. The directions of the arrows (102, 104 and 114) that indicate the input signals in FIG. 5 are the same as the directions of the arrows applied with the same reference numerals in FIG. 1. Therefore, the direction 106 of the magnetic field generated by the first input side coil 22 in FIG. 5 and the direction 116 of the magnetic field generated by the second input side coil 42 are the same as the directions of the corresponding arrows shown in FIG. 1. Consequently, the direction 110 of the detection signal that is outputted by the first output side coil 24 due to the input signal in FIG. 5 and the direction 120 of the detection signal outputted by the second output side coil 44 are the same as the directions of the corresponding arrows shown in FIG. 1. Moreover, the directions 130 of the noise magnetic field shown in FIG. 5 are also the same as the directions of the corresponding arrows shown in FIG. 1. Therefore, of the noise magnetic field 130 shown in FIG. 5, the direction of the noise magnetic field component 132 affecting on the first output side coil 24 and the direction of the noise magnetic field component 134 affecting on the second output side coil 44 are the same as the directions of the corresponding arrows shown in FIG. 1.

Since the directions of the arrows shown in FIG. 5 are the same as those shown in FIG. 1, the directions of the magnetic fields and detection signals in FIG. 5 are the same as the directions of the corresponding magnetic fields and detection signals shown in FIG. 1. Therefore, the essential signal 110 and the noise signal 136 that are included in the detection signal outputted by the first output side coil 24 have the same polarity. On the other hand, the essential signal 120 and the noise signal 138 that are included in the detection signal outputted by the second output side coil 44 have opposite polarities.

The signal transmission device 100d has a signal output section 50c. The signal output section 50c connects the first output side coil 24 and the second output side coil 44 in anti-series between the pair of output terminals 12a, 12b. To be more precise, the signal output section 50c connects the output terminal 12a to the output end 24b of the first output side coil 24. The signal output section 50c further connects the input end 24a of the first output side coil 24 to the input end 44a of the second output side coil 44. The signal output section 50c further connects the output end 44b of the second output side coil 44 to the other output terminal 12b. The term, "in anti-series" means as described above.

The external second circuit 910 is connected to the pair of output terminals 12a, 12b. One of the output terminals (the output terminal 12b) is connected to the ground 912 of the external second circuit 910.

In the signal output section 50c, the output end 44b of the second output side coil 44 is connected to the ground 912 of the external second circuit 910 via the output terminal 12b. Therefore, the detection signal outputted by the second output side coil 44 is expressed by the voltage of the input end 44a of the second output side coil 44 with respect to the potential of the ground 912.

The input end 44a of the second output side coil 44 is connected to the input end 24a of the first output side coil 24. The output end 24b of the first output side coil 24 is connected to the terminal 12a which is not connected to the ground 912. Therefore, an output signal outputted between the pair of output terminals 12a, 12b is obtained by adding together the potential level of the input end 44a with respect to the ground potential level and the potential level of the output end 24b with respect to the potential level of the input end 24a (this potential level is also the potential level of the input end 44a). The detection signal of the first output side coil 24 is expressed by the potential level of the output end 24b with respect to the potential level of the input end 24a.

As with the signal transmission device 100 of the first embodiment shown in FIG. 1, in the signal transmission device 100d shown in FIG. 5 the polarity of the essential signal 110 included in the detection signal of the first output side coil 24 is the same as the polarity of the essential signal 120 included in the detection signal of the second output side coil 44.

On the other hand, the polarity of the noise signal 136 included in the detection signal of the first output side coil 24 is opposite to the polarity of the noise signal 138 included in the detection signal of the second output side coil 44.

The relationship between the abovementioned polarities is held regardless of the directions of the input signal 102 or the direction of the noise magnetic field 130. In other words, the arrangement of the pair of output side coils 24, 44 can be expressed as follows. The pair of output side coils are arranged to have a relationship in which, when the direction of the magnetic field acting on one of the output side coils is the same as the direction of the magnetic field acting on the other output side coil, the polarity of the detection signal outputted by the former output side coil is opposite to the polarity of the detection signal outputted by the latter output side coil.

In the signal output section 50c, the first output side coil 24 and the second output side coil 44 are connected in anti-series between the pair of output terminals 12a, 12b. Because of this configuration, an output signal that is obtained by adding up the detection signal of the first output side coil 24 and the detection signal of the second output side coil 44 is outputted from the output terminal 12a.

Figure 6:
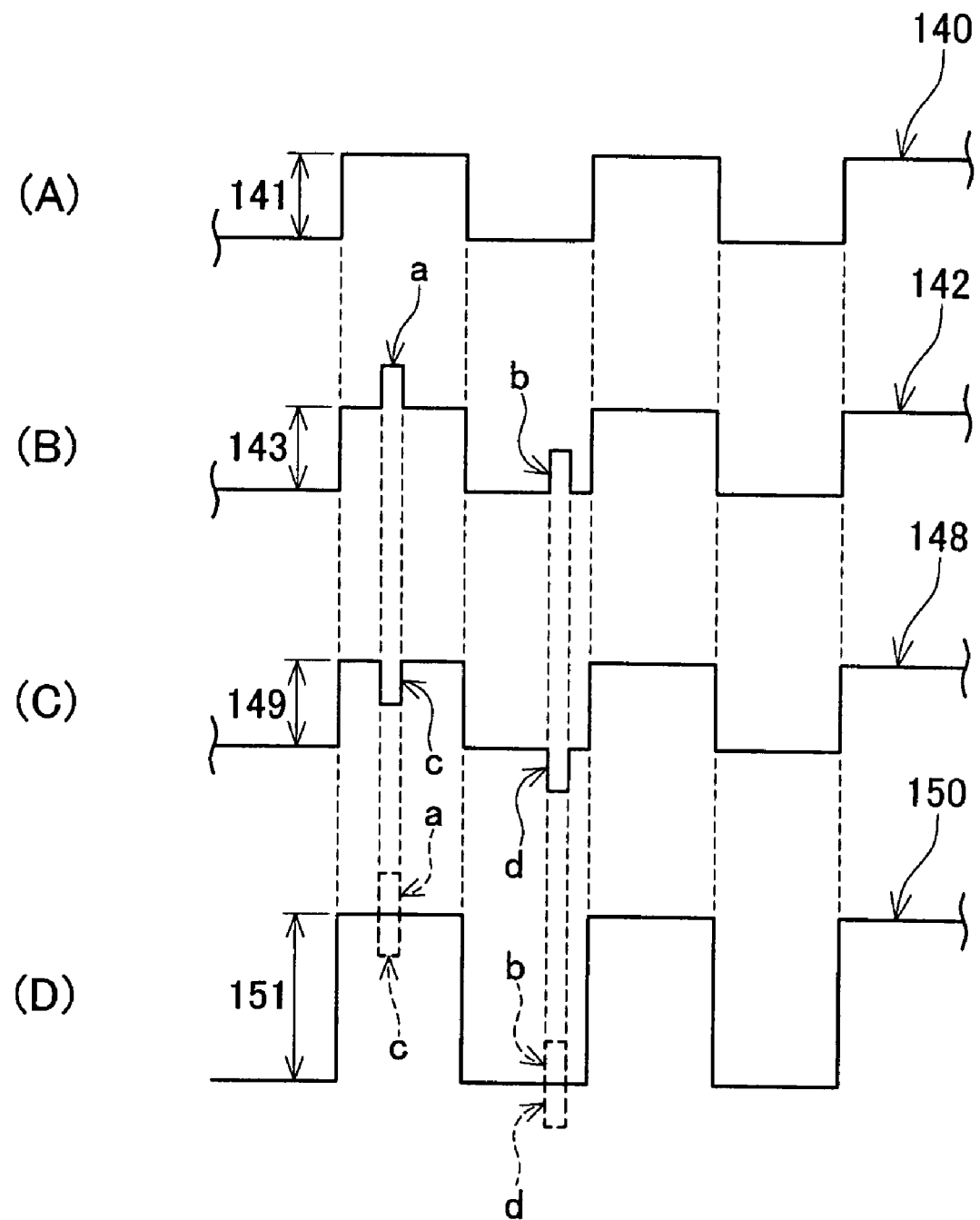
FIG. 6A is a schematic time chart of an input signal that is inputted by the signal transmission device of the third embodiment.
FIG. 6B is a schematic time chart of a detection signal that is outputted by the first output side coil.
FIG. 6C is a schematic time chart of a detection signal that is outputted by the second output side coil.
FIG. 6D is a schematic time chart of an output signal that is outputted by a signal output section.

FIG. 6 shows a schematic time chart of the input signal, the detection signal outputted from the first output side coil 24, the detection signal outputted from the second output side coil 44, and the output signal outputted from the output terminal 12a. FIG. 6A shows a waveform of the input signal 140. FIG. 6B shows a waveform of the detection signal 142 outputted from the first output side coil 24. FIG. 6C shows a waveform of a detection signal 148 outputted from the second output side coil 44. FIG. 6D shows a waveform of the output signal 150 outputted from the output terminal 12a. The amplitude of the input signal 140 is shown with the reference numeral 141. The amplitude of the detection signal 142 is shown with the reference numeral 143. The amplitude of the detection signal 148 is shown with a reference numeral 149. The amplitude of the output signal 150 is shown with a reference numeral 151. Each of the broken lines vertically connecting FIG. 6A through FIG. 6D indicates the same timing for all signals.

The waveform of the detection signal 142 (FIG. 6B) outputted from the first output side coil 24 has the same polarity as the waveform of the input signal 140 (FIG. 6A), except for the noise signal components (a), (b). The amplitude 143 of the detection signal 142 is the same as the amplitude 141 of the input signal 140. The noise signal components (a), (b) are added to the detection signal 142.

As described above, the waveform of the detection signal 148 (FIG. 6C) outputted from the second output side coil 44 has the same polarity as the waveform of the input signal 140 (FIG. 6A) of the first input side coil 22. The amplitude 149 of the detection signal 148 is the same as the amplitude 141 of the input signal 140. The noise signal components (c), (d) are added to the detection signal 149.

As described above, the noise signal component (a) (FIG. 6B) included in the detection signal 142 outputted from the first output side coil 24 has a polarity opposite to the polarity of the noise signal component (c) included in the detection signal 148 outputted from the second output side coil 44. Since the noise signal components (a) and (c) are caused by the noise magnetic field at the same timing, the noise signal components (a) and (c) are occurred at the same timing. Similarly, the noise signal component (b) included in the detection signal 142 (FIG. 6B) has a polarity opposite to the polarity of the noise signal component (d) included in the detection signal 148 (FIG. 6C), and the noise signal components (b) and (d) are occurred at the same timing.

On the other hand, the essential signal (waveforms other than the waveforms of the noise signal components (a), (b) in the detection signal 142 shown in FIG. 6B) included in the detection signal 142 outputted by the first output side coil 24 has the same polarity as the essential signal (waveforms other than the waveforms of the noise signal components (c), (d) in the detection signal 148 shown in FIG. 6C) included in the detection signal 148 outputted by the second output side coil 44.

The signal output section 50c shown in FIG. 5 adds together the detection signal 142 (FIG. 6B) of the first output side coil 24 and the detection signal 148 (FIG. 6B) of the second output side coil 44. The signal output section 50c then outputs the result of addition as the output signal to the output terminal 12a. FIG. 6D shows a waveform of the output signal 150. As shown in FIG. 6D, of the detection signal 142 and detection signal 148, the essential signals caused by the input signal 140 are added together. The amplitude 151 of the output signal 150 is twice as large as the amplitude 141 of the input signal 140.

On the other hand, the noise signal component (a) included in the detection signal 142 (FIG. 6B) and the noise signal component (c) included in the detection signal 148 (FIG. 6C) are occurred at the same time and have opposite polarities. Therefore, by adding up the detection signal 142 and the detection signal 148, the noise signal components (a), (c) are offset. Similarly, the noise signal component (b) included in the detection signal 142 and the noise signal component (d) included in the detection signal 148 are also occurred at the same time and have opposite polarities. Therefore, by adding up the detection signal 142 and the detection signal 148, the noise signal components (b), (d) are also offset. As a result, the output signal 150 becomes a signal in which the noise signal components are eliminated and the amplitude of the essential signal (corresponding to the input signal) is doubled up, as shown in FIG. 6D.

As described above, in the signal transmission device 100c of the present embodiment, the pair of input side coils 22, 42 are arranged such that the directions of the magnetic fields generated by both input coils 22, 42 by the input signal are opposite with each other. Moreover, the output side coils 24, 44 are arranged so as to output detection signals having opposite polarities with each other when the uniform magnetic field acts on both output side coils. The signal output section 50c connects the pair of output side coils 24, 44 in anti-series between the pair of output terminals 12a, 12b. The signal output section 50c adds together the detection signals of the pair of output side coils 24, 44 that are connected in anti-series, and outputs the result of addition as the output signal to the pair of output terminals 12a, 12b. According to this configuration, the output signal can be obtained in which the noise signals are offset and the amplitude are doubled up corresponding to the amplitude of input signal. The signal transmission device 100d can reduce the noise signal caused by the external noise magnetic field, and improve the S/N ratio.

Fourth Embodiment

Figure 7:
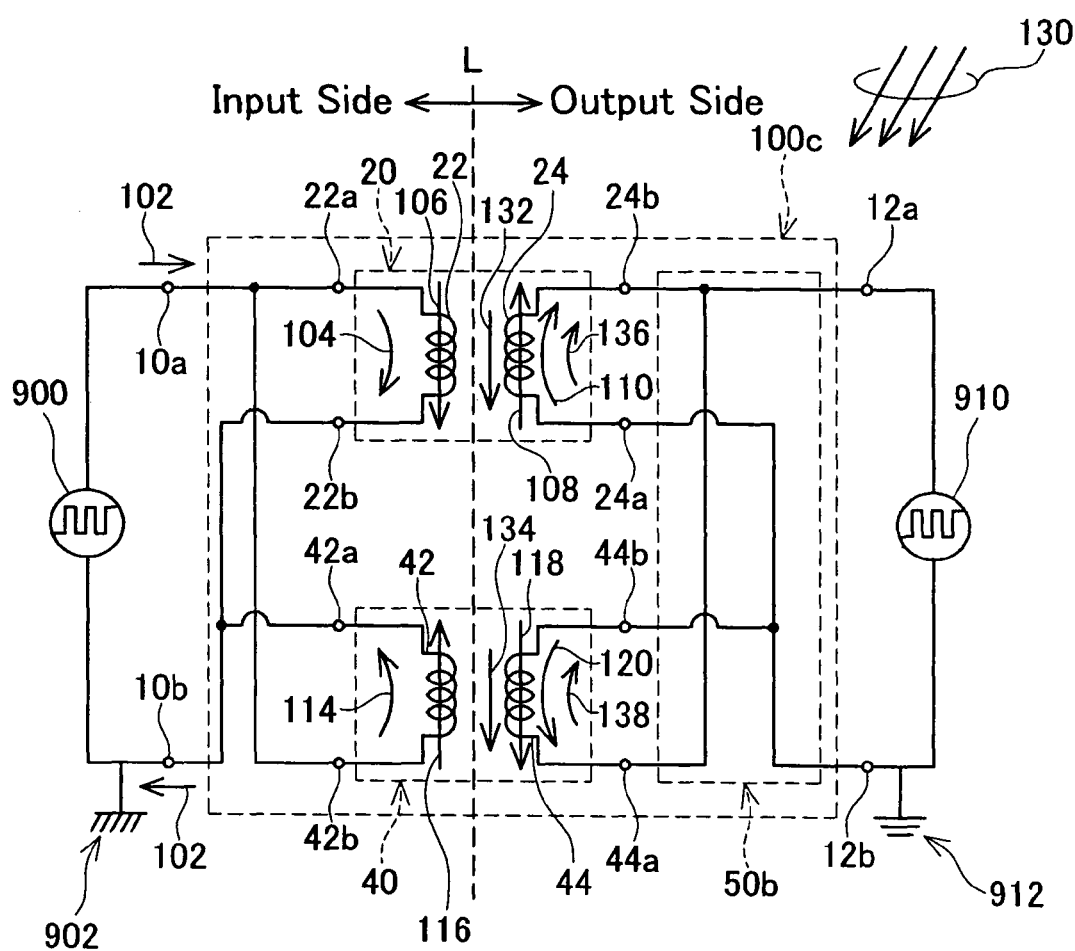
FIG. 7 is a circuit diagram of a signal transmission device of a fourth embodiment.

Next, the fourth embodiment of the present invention will be described. FIG. 7 is a circuit diagram of a signal transmission device 100c according to the fourth embodiment. The configuration of the signal output section 50b of the signal transmission device 100c shown in FIG. 7 is different from that of the signal transmission device 100d shown in FIG. 5. Explanations of other parts are omitted.

The signal output section 50b will be described. The signal output section 50b is a circuit in which the input end 24a and the output end 24b of the first output side coil 24 and the input end 44a and the output end 44b of the second output side coil 44 are connected to the output terminals 12a, 12b. In this circuit, the output end 24b of the first output side coil 24 and the input end 44a of the second output side coil 44 are connected to the output terminals 12a. The input end 24a of the first output side coil 24 and the output end 44b of the second output side coil 44 are connected to the other output terminal 12b. The signal output section 50b is a circuit that connects the first output side coil 24 and the second output side coil 44 in anti-parallel.

The pair of output terminals 12a, 12b are connected to the external second circuit 910. The output terminals 12b is connected to the ground 912 of the external second circuit 910. Therefore, in the signal transmission device 100c, potential of the input end 24a of the first output side coil 24 and potential of the output end 44b of the second output side coil 44 have ground potential. Therefore, a signal at the output end 24b can be regarded as the detection signal of the first output side coil 24. Similarly, a signal at the input end 44a of the second output side coil 44 can be regarded as the detection signal of the second output side coil 44.

As shown by the arrow 110 and the arrow 120 in FIG. 7, the following relationship is hold between the detection signal outputted by the first output side coil 24 due to the input signal 102 and the detection signal outputted by the second output side coil 44. When the potential of the output end 24b with respect to the potential of the input end 24a of the first output side coil 24 is positive, the potential of the input end 44a with respect to the potential of the output end 44b of the second output side coil 44 is also positive. In other words, when the direction (arrow 106) of the magnetic field acting on the output side coils 24, is opposite to the direction (arrow 116) of the magnetic field acting on the other output side coil 44, the polarity of the detection signal outputted by the output side coil 24 is opposite to the polarity of the detection signal outputted by the other output side coil 44. At this moment, the detection signals outputted by the output side coils 24, 44 due to the noise magnetic field 130 acting substantially uniformly on the signal transmission device 100c have polarities that are opposite with each other. This relationship of polarities can be understood from the facts that, when the induced current in the first output side coil 24 caused by the noise magnetic field 130 is in the direction of the arrow 136, the detection signal of the first output side coil 24 is the potential difference between the input end 24a and the output end 24b, and that, when the induced current in the second output side coil 44 caused by the noise magnetic field 130 is in the direction of the arrow 138, the detection signal of the second output side coil 44 is the potential difference between the output end 44b and the input end 44a.

In other words, in the signal transmission device 100c, when the input signal is applied to the pair of input terminals 10a, 10b, the input side coil 22 generates a magnetic field in a direction opposing a direction of the magnetic field generated by the other input side coil 44. The output side coils 24, 44 output the detection signals having the same polarity, when the direction of the magnetic field acting on the output side coil 24 is opposite to the direction of the magnetic field acting on the other output side coil 44. This fact means that the output side coils 24, 44 output the detection signals having the opposite polarities, when the uniform magnetic field (the noise magnetic field) acts on both output side coils 24, 44.

Therefore, the relationship of polarities among the input signal, the detection signals outputted by the output side coils 24, 44, and the output signal will be the same as the relationship of polarities shown in FIG. 6. The signal transmission device 100c shown in FIG. 7 can also achieve the same effects as the signal transmission device 100d shown in FIG. 5.

The signal output section 50b of the signal transmission device 100c shown in FIG. 7 connects the first output side coil 24 and second output side coil 44 in anti-parallel between the pair of output terminals 12a, 12b. The signal output section 50b adds together the induced currents (the detection signals) outputted by the output side coils 24, 44, and outputs the result of addition as the output signal. Therefore, the signal transmission device 100c is suitable for transmitting a signal in which a change of a current value expresses a change of the signal.

On the other hand, the signal output section 50c of the signal transmission device 100d shown in FIG. 5 connects the first output side coil 24 and second output side coil 44 in anti-series between the pair of output terminals 12a, 12b. The signal output section 50c adds together the potential difference between the input end 24a and the output end 24b of the first output side coil 24 and the potential difference between the output end 44b and the input end 44a of the second output side coil 44, and outputs the result of addition as the output signal. Therefore, the signal transmission device 100d is suitable for transmitting a signal in which a change of voltage expresses a change of the signal.

In the signal transmission device 100d shown in FIG. 5 or the signal transmission device 100c shown in FIG. 7, the amplitude of the input signal and the amplitude of the output signal can be conformed to each other by appropriately adjusting the ratio between the number of windings of the input side coil and the number of windings of the output side coil of each of the pair of transformers.

Moreover, the signal output section 50b of the signal transmission device 100c shown in FIG. 7 is a circuit that simply connects the pair of output side coils 24, 44 in anti-parallel between the pair of output terminals 12a, 12b. The signal output section 50c of the signal transmission device 100d shown in FIG. 5 is a circuit that simply connects the pair of output side coils 24, 44 in anti-series between the pair of output terminals 12a, 12b. Therefore, the signal transmission device 100c or 100d can be realized by configuring the signal output sections thereof with the simple circuits without differential amplifiers.

In the signal transmission device 100 shown in FIG. 1 and the signal transmission device 100b shown in FIG. 4, on the other hand, the signal output sections thereof have the differential amplifiers respectively. By providing the differential amplifier, the influence of the external noise magnetic field can be reduced, and the influence of the external electric field can also be reduced.

In the signal transmission device 100 shown in FIG. 1, the signal transmission device 100b shown in FIG. 4, the signal transmission device 100d shown in FIG. 5, and the signal transmission device 100c shown in FIG. 7, the first input side coil 22 and the second input side coil 42 correspond to the pair of coils that are connected between the pair of input terminals. The first output side coil 24 and the second output side coil 44 correspond to the pair of magnetic sensors. The induced currents outputted from the first output side coil 24 and the second output side coil 44 corresponds to the detection signals outputted by each of the magnetic sensors in response to the magnetic field acting on the magnetic sensors.

Next, an example of the specific structures of the first transformer 20 and the second transformer 40 that can be provided in the signal transmission device 100, the signal transmission device 100b, the signal transmission device 100c or the signal transmission device 100d illustrated in the above embodiments will be described. The transformers described hereinafter are formed on a semiconductor substrate. By forming the transformers on the semiconductor substrate, the size of the signal transmission device can be reduced.

Figure 8A:
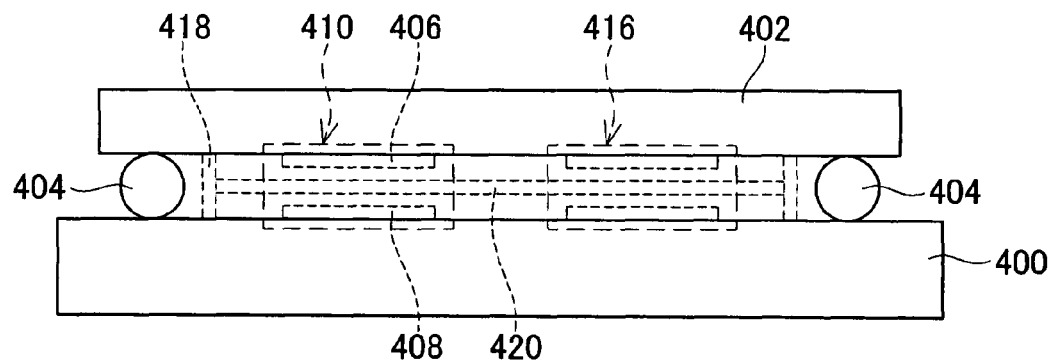
FIG. 8A is a schematic side view of a transformer that is formed on a semiconductor substrate.
Figure 8B:
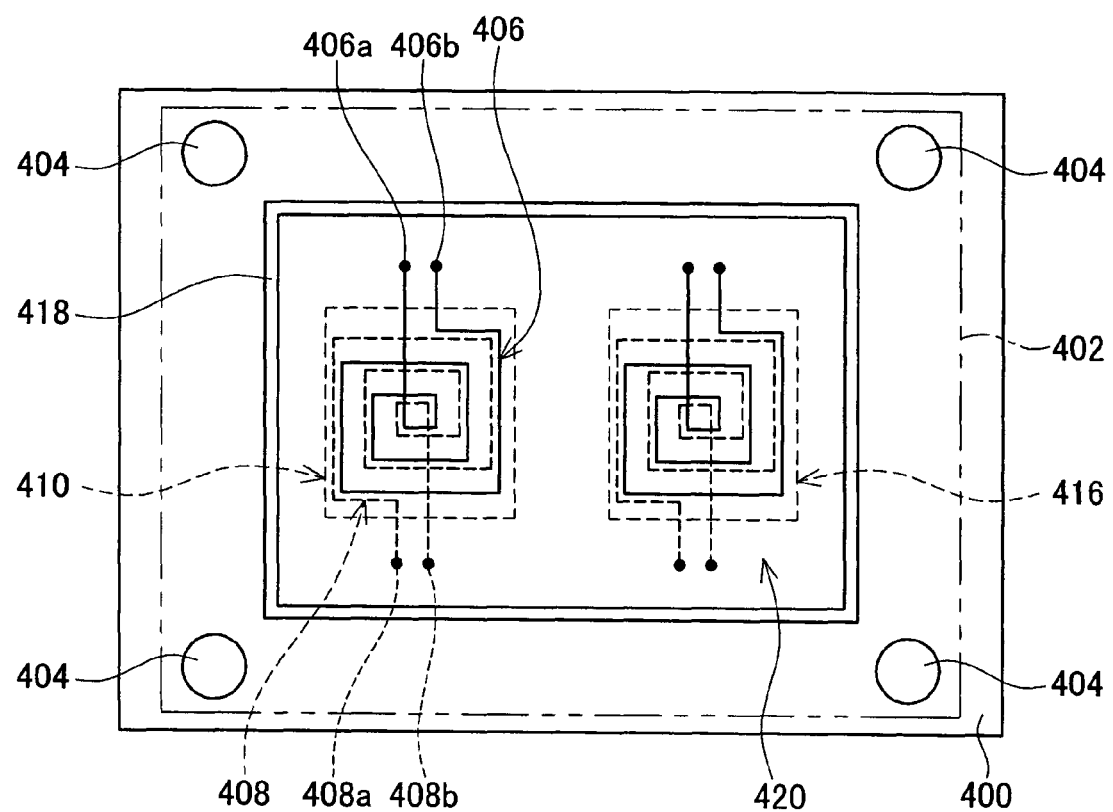
FIG. 8B is a schematic plan view a transformer shown in FIG. 8A.

The transformers formed on the semiconductor substrate are described with reference to FIG. 8. FIG. 8A is a schematic side view of a semiconductor substrate 400 to which an IC chip 402 is fixed. FIG. 8B is a schematic plan view of the semiconductor substrate 400 to which the IC chip 402 shown in FIG. 8A is fixed. It should be noted that the IC chip 402 placed on top of the semiconductor substrate 400 is illustrated with a virtual line (two-dot chain line) in the schematic plan view of FIG. 8B. A first transformer 410 and a second transformer 416 are formed between the semiconductor substrate 400 and the IC chip 402.

The IC chip 402 is fixed onto the semiconductor substrate 400 via solder bumps 404.

The first transformer 410 is formed by a first coil 406 formed on a bottom surface of the IC chip 402 and a second coil 408 formed at a position facing the first coil 406 on the surface of the semiconductor substrate 400.

The first coil 406 is formed by a lead wire that is wound in a flat form at the bottom of the IC chip 402. Both ends of the lead wire forming the first coil 406 are first coil terminals 406a, 406b. The first coil 406 is electrically connected to the inside of the IC chip 402 via the first coil terminals 406a, 406b.

The second coil 408 is formed in spiral at a position so as to face the first coil 406 on the surface of the semiconductor substrate 400. The second coil 408 that is formed on the surface of the semiconductor substrate 400 is a spiral conductive section that is formed on the surface of the semiconductor substrate 400 by means of a semiconductor processing technology such as etching or processing of metallic film evaporation. Both ends of the conductive section are second coil terminals 408a, 408b. The second coil 408 is electrically connected to other IC chip or a circuit via the second coil terminals 408a, 408b.

The first coil 406 is arranged in opposition to the second coil 408. When current flows into one of the coils, induced current is generated in the other coil. The second transformer 416 is formed in the same manner as the first transformer 410.

The axial direction of the first transformer 410 (direction that passes through the center of the coils and is perpendicular to the surface of the winding) is arranged in parallel with the axial direction of the second transformer 416. Therefore, as described in the above embodiments, the pair of transformers 410 and 416 can satisfy a relation in which the direction of a magnetic field generated by the input side coil of one of the transformers is opposite to the direction of a magnetic field generated by the input side coil of the other transformer when current is applied. Moreover, the output side coils of the transformers can satisfy a relation in which induced currents (detection signals) having the same polarity are outputted when the uniform magnetic field acts on the output side coils. Alternatively, the output side coils of the transformers can satisfy a relation in which induced currents (detection signals) having opposite polarities are outputted when the uniform magnetic field acts on the output side coils.

A conductive member 418 is arranged so as to surround the first transformer 410 and second transformer 416. By arranging the conductive member 418, the influence of the external noise magnetic field acting on the pair of transformers 410 and 416 can be reduced.

An electrostatic shielding film 420 is arranged between the first coil 406 and second coil 408 of the first transformer 410 and between both coils of the second transformer 416. By arranging the electrostatic shielding film 420 between both coils of each transformer, the influence of noises caused by an external electric field can be reduced.

It should be noted that the first coil 406 and the second coil 408 may be formed by, for example, a one-turn coil as long as both coils function as coils.

Figure 9:
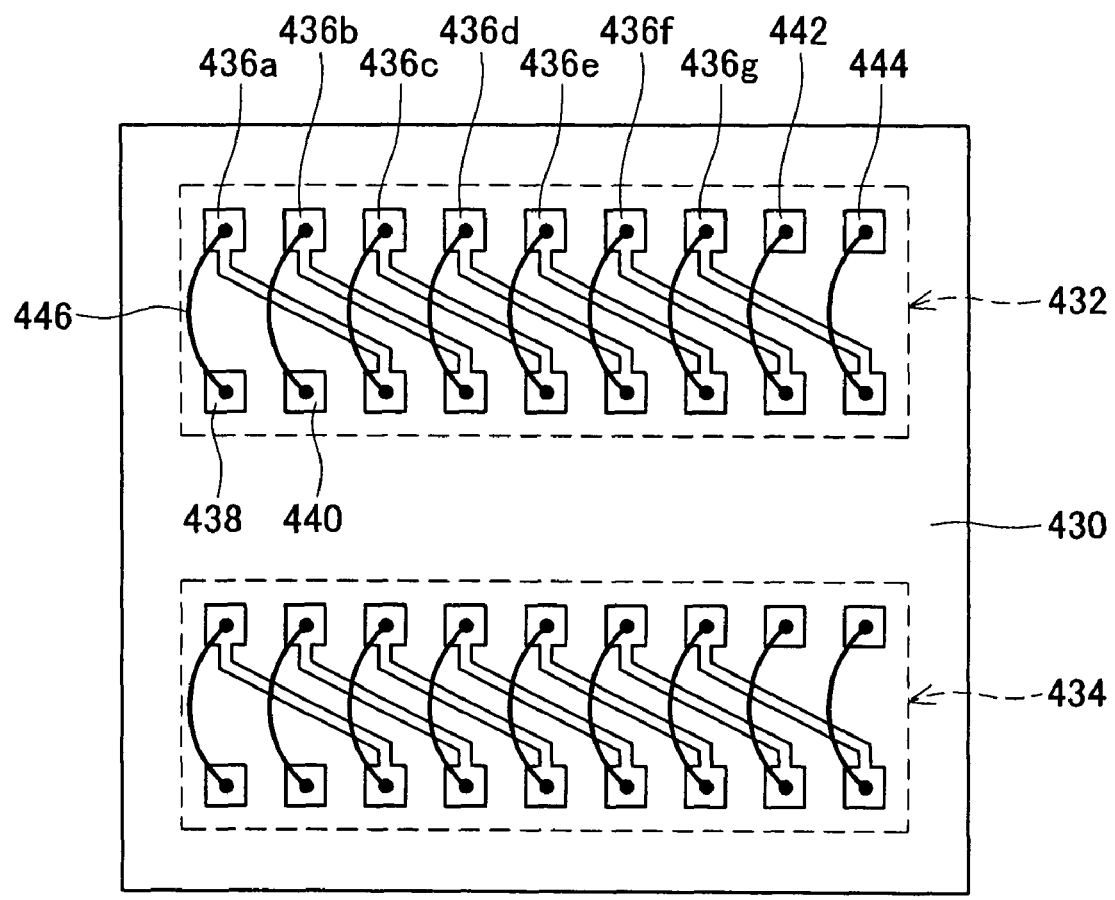
FIG. 9 is a schematic plan view of a second example of the transformer formed on the semiconductor substrate.

Other type of transformer that can be formed on the semiconductor substrate will be described with reference to FIG. 9. Elongated conductor sections 436a through 436g and terminals 438, 440, 442 and 444 are formed on a semiconductor substrate 430 by means of the semiconductor processing technology such as etching or evaporation processing.

One end of the conductor section 436a is connected to the terminal 438 by a bonding wire 446. The other end of the conductor section 436a is connected one end of the conductor section 436c by a bonding wire. The other end of the conductor section 436c is connected to one end of the conductor section 436e by a bonding wire. Similarly, the conductor section 436e is connected to the conductor section 436g by a bonding wire. The conductor section 436g is connected to the terminal 444 by a bonding wire. It should be noted that in FIG. 9 a reference numeral 446 is applied only to the leftmost bonding wire, and no reference numerals are applied to the other bonding wires.

By such connections described above, a first coil having the terminal 438 and terminal 444 at both ends thereof is formed by the conductor sections 436a, 436c, 436e and 436g and the bonding wires 446 connecting these conductive sections. Similarly, a second coil is formed by sequentially connecting the terminal 440, the conductor sections 436b, 436d, 436f and the terminal 442 by bonding wires. A transformer 432 is formed by this first coil and the second coil. The axis of the first coil is the same as the axis of the second coil.

A transformer 434 can be formed in the similar manner. The axis directions of the pair of transformers 432 and 434 are formed in parallel. Therefore, as described in the above embodiments, the pair of transformers 432, 434 can satisfy a relation in which the directions of magnetic fields generated by input side coils of the pair of transformers are opposite to each other when current is applied to the input side coils. Moreover, output side coils of the transformers can satisfy a relation in which induced currents (detection signals) having the same polarity are outputted when the uniform magnetic field acts on the output side coils. Alternatively, the output side coils of the transformers can satisfy a relation in which induced currents (detection signals) having opposite polarities are outputted when the uniform magnetic field acts on the output side coils.

Figure 10:
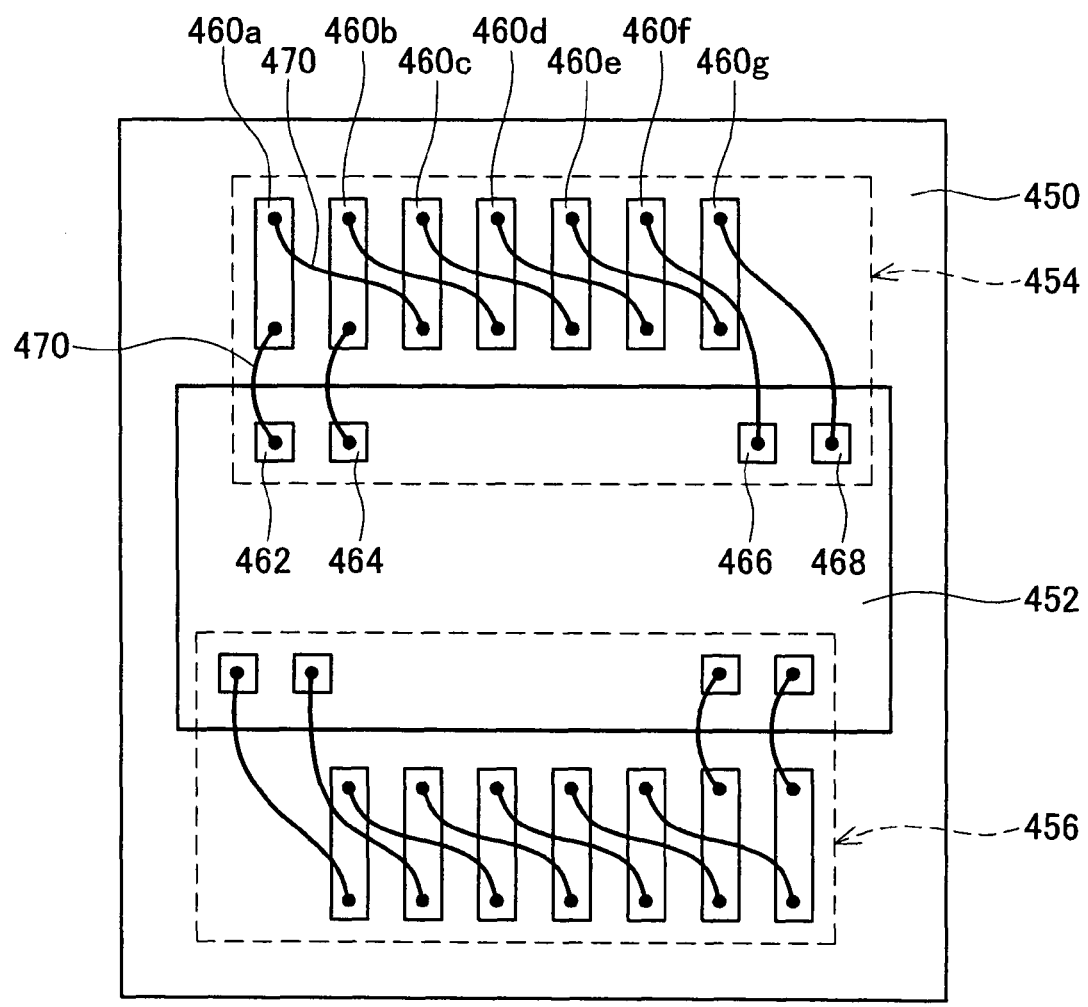
FIG. 10 is a schematic plan view of a third example of the transformer formed on the semiconductor substrate.

Yet another transformer being formed on the semiconductor substrate will be described with reference to FIG. 10. In this example, an IC chip 452 is mounted in the center of an IC package 450. Lead frames 460a through 460g are formed on the side of the IC chip 452 on top of the IC package 450. Terminals 462, 464, 466 and 468 are formed on the IC chip 452.

The terminal 462 on the IC chip 452 and one end of the lead frame 460a are connected to each other by a bonding wire 470. The other end of the lead frame 460a is connected to one end of the lead frame 460c by the bonding wire 470. As with FIG. 9, the lead frame 460c, the lead frame 460e, the lead frame 460g and the terminal 468 are sequentially connected by bonding wires. A first coil having the terminal 462 and the terminal 468 at both ends thereof is formed by the lead frame 460a, the lead frame 460c, the lead frame 460e, the lead frame 460g and the bonding wires 470. Similarly, a second coil having the terminal 464 and the terminal 466 at both ends thereof is formed by the lead frame 460b, the lead frame 460d, the lead frame 460f and the bonding wires 470. A first transformer 454 is formed by the first coil and the second coil. A second transformer 456 is formed in the same manner. Accordingly, the pair of transformers 454 and 456 is formed.

The first transformer 454 and the second transformer 456 are formed so that the directions of axis lines thereof are arranged in parallel. Therefore, as described in the above embodiments, the pair of transformers 454, 456 can satisfy a relation in which the directions of magnetic fields generated inside of the input side coils are opposite to each other when the current (the input signal) is applied to the input side coils of the transformers. Moreover, output side coils of these transformers can satisfy a relation in which induced currents (detection signals) having the same polarity are outputted when the uniform magnetic field acts on the output side coils. Alternatively, the output side coils of the transformers can satisfy a relation in which induced currents (detection signals) having opposite polarities are outputted when the uniform magnetic field acts on the output side coils.

The pair of transformers shown in FIG. 8 can be formed on a single semiconductor substrate by means of a multi-layer interconnection technology. Components other than the transformers of the signal transmission device may be embedded in the IC chip. Accordingly, a compact signal transmission device can be realized.

By forming the pair of transformers on the semiconductor substrate, the pair of transformers (i.e., the pair of input side coils and the pair of output side coils) can be arranged at positions close to each other. By arranging the pair of output coils at the positions close to each other, the noise magnetic field acts uniformly on the output side coils of the transformers. The noise signals included in the detection signals of the pair of output side coils can be made as signals having substantially the same waveform. The noise signals can be removed more accurately when obtaining the difference between the detection signals of the pair of output side coils. A signal transmission device that eliminates the influence of the external noise magnetic field more accurately can be realized.

Fifth Embodiment

The fifth embodiment will be described next. The signal transmission device of the fifth embodiment uses hall elements as the magnetic sensors, in place of the coils. The hall elements output hall voltages corresponding to the strength of an acting magnetic field.

Figure 11:
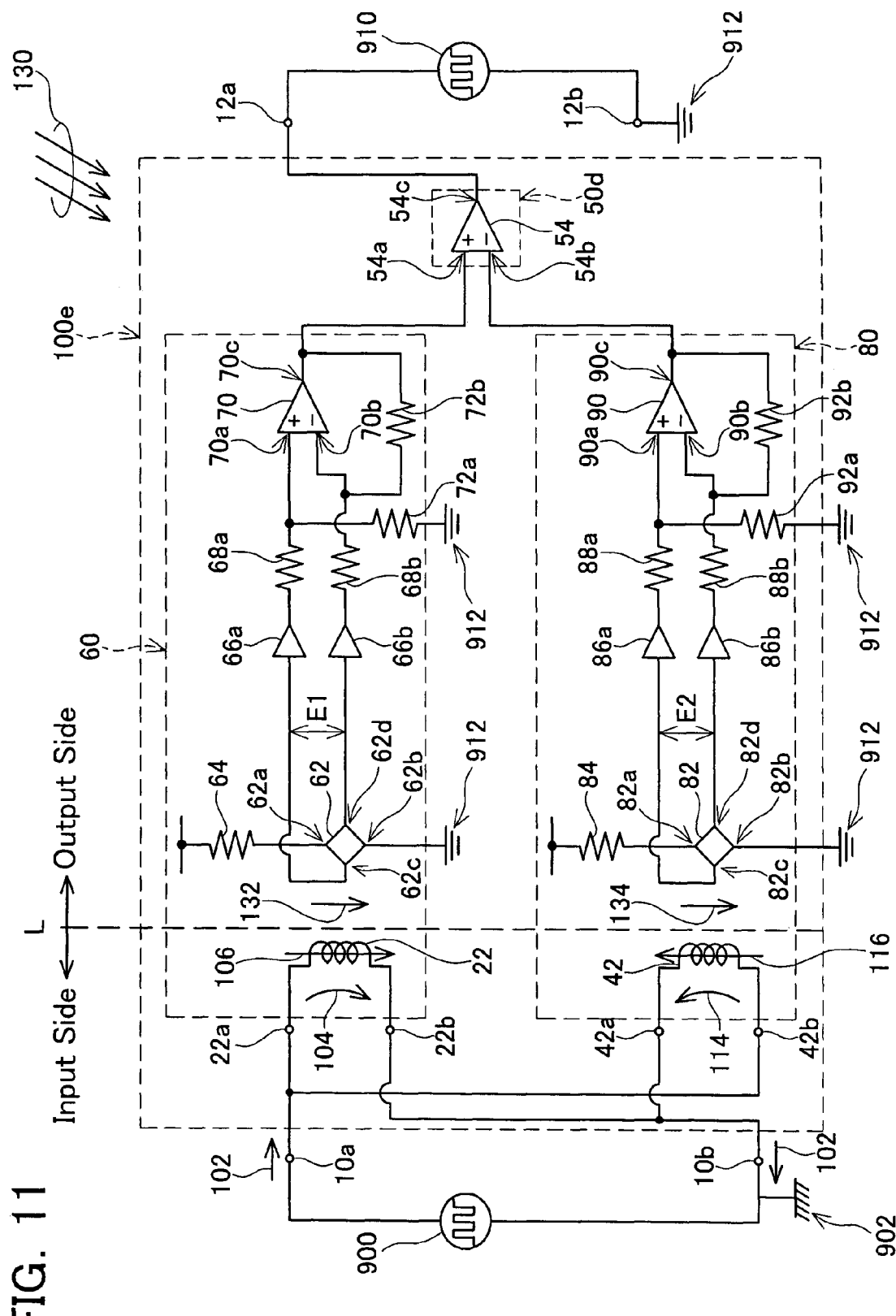
FIG. 11 is a circuit diagram of a signal transmission device of a fifth embodiment.

FIG. 11 shows a circuit diagram of the signal transmission device 100e of the fifth embodiment. The signal transmission device 100e has the pair of input terminals 10a, 10b, the pair of output terminals 12a, 12b, a pair of signal transmission sections (a first signal transmission section 60 and a second signal transmission section 80), and a signal output section 50d. The same reference numerals are applied to the components that are same as the components shown in FIG. 1. Explanations for the components indicated with the same reference numerals as the components shown in FIG. 1 are omitted. The pair of signal transmission sections 60, 80 corresponds to the pair of transformers 20, 40 in the signal transmission device 100 of the first embodiment. Each of the signal transmission sections transmits a signal through the magnetic field.

The first signal transmission section 60 has the first input side coil 22, a first hall element 62 and a differential amplifier 70. The first input side coil 22 and the first hall element 62 are electrically insulated from each other but are joined with each other magnetically. Similarly, the second signal transmission section 80 has the second input side coil 42, a second hall element 82 and a differential amplifier 90. The second input side coil 42 and the second hall element 82 are electrically insulated from each other but are joined with each other magnetically. Here, "joined magnetically" means that the hall elements generate hall voltages corresponding to the magnetic fields generated by the input side coils.

In the signal transmission device 100e, the circuit is insulated between the first input side coil 22 and the first hall element 62, and between the second input side coil 42 and the second hall element 82. In order to show such insulation, FIG. 11 shows the broken line L that passes between the first input side coil 22 and the first hall element 62 of the first signal transmission section 60, and between the second input side coil 42 and the second hall element 82 of the second signal transmission section 80. The left side of the broken line L is referred to as "the input side", while the right side of the broken line L is referred to as "the output side". The configuration of the input side is the same as the one shown in FIG. 1. Therefore, when an input signal is inputted from the external first circuit 900, the pair of input side coils 22 and 42 generate magnetic fields that have spatially in opposite directions, as shown in the arrow 106 and the arrow 116. Since the configuration of the input side coils is the same as the one shown in FIG. 1, detailed explanation thereof is omitted.

The first hall element 62 provided in the first signal transmission section 60 has four terminals 62a, 62b, 62c and 62d. The terminal 62a of the first hall element 62 is pulled up to a predetermined voltage via a resistance 64. The terminal 62b is connected to the ground 912 of the second circuit 910. When the predetermined voltage is applied between the terminals 62a and 62b, the first hall element 62 generates hall voltage E1 between the terminals 62c and 62d in accordance with the strength of the magnetic field acting on the hall element 62. The terminals 62c and 62d that output the hall voltages corresponding to the strength of the magnetic field are referred to as "hall voltage output terminals". The first hall element 62 generates positive voltage at the terminal 62c with respect to the potential of the terminal 62d when the magnetic field acts in the direction of the arrow 106. On the contrary, the first hall element 62 generates negative voltage at the terminal 62c with respect to the potential of the terminal 62d when the magnetic field acts in the direction opposed to the arrow 106.

The hall voltage output end 62c of the first hall element 62 is connected to a noninverting input end 70a of the differential amplifier 70 via a resistance 68a and a buffer 66a. The buffer 66a has a gain equal to 1.0. The noninverting input end 70a is also connected to the ground 912 of the second circuit 910 via a resistance 72a.

The hall voltage output end 62d of the first hall element 62 is connected to an inverting input end 70b of the differential amplifier 70 via a resistance 68b and a buffer 66b. The buffer 66b has a gain equal to 1.0. The inverting input end 70b is also connected to an output end 70c of the differential amplifier 70 via a resistance 72b. By this configuration described above, an output (i.e., the detection signal) of the first signal transmission section 60 having the first hall element 62 is expressed as the difference between the potential of the ground 912 of the second circuit 910 and potential of the output end 70c of the differential amplifier 70.

The buffers 66a and 66b have the same performance. The resistance values of the resistances 68a and 68b are equal to each other. The resistance values of the resistances 72a and 72b are also equal to each other. The buffers 66a, 66b and the resistances 68a, 68b, 72a and 72b are inserted in order to operate the differential amplifier 70 stably.

The output end 70c of the differential amplifier 70 is connected to the noninverting input end 54a of the differential amplifier 54 provided in the signal output section 50d.

It should be noted that the buffers 66a, 66b, the resistances 68a, 68b, 72a and 72b, and the differential amplifier 70 are inserted in order to make the output signal (the detection signal) of the hall element 62 as a voltage signal with respect to the ground potential of the second circuit 910. Here, it should be noted that the differential amplifier 70 is not a "differential amplifier for obtaining the difference between the detection signals outputted by the pair of magnetic sensors (hall elements 62, 82)". The differential amplifier 54 of the signal output section 50d corresponds to the "differential amplifier for obtaining the difference between the detection signals outputted by the pair of magnetic sensors (hall elements 62, 82)".

The circuit configuration of the second signal transmission section 80 is the same as the circuit configuration of the first signal transmission section 60. The second hall element 82 provided in the second signal transmission section 80 has four terminals 82a, 82b, 82c and 82d. The terminal 82a of the second hall element 82 is pulled up to a predetermined voltage via a resistance 84. The terminal 82b is connected to the ground 912 of the second circuit 910. When a predetermined voltage is applied between the terminals 82a and 82b, the second hall element 82 outputs, between the terminals 82c and 82d, hall voltage E2 in response to the strength of a magnetic field acting on the hall element 82. The hall voltage E2 outputted by the hall element 82 is the same as "the detection signal outputted by the magnetic sensor". The terminals 82c and 82d that output the hall voltage corresponding to the strength of the magnetic field acting on the hall element 82 is referred to as "hall voltage output terminals".

The second hall element 82 outputs positive voltage to the terminal 82c with respect to the potential level of the terminal 82d when the magnetic field acts on the second hall element 82 in the direction of the arrow 106. On the contrary, the second hall element 82 outputs negative voltage to the terminal 82c with respect to the potential level of the terminal 82d when the magnetic field acts on the second hall element 82 in the direction opposed to the arrow 106. Therefore, the first hall element 62 of the first signal transmission section 60 and the second hall element 82 of the second signal transmission section 80 are arranged in a relation in which the hall voltages (the detection signals) having the same polarity are outputted when the uniform magnetic field acts on both hall elements 62, 82.

The hall voltage output end 82c of the second hall element 82 is connected to a noninverting input end 90a of the differential amplifier 90 via a resistance 88a and a buffer 86a. The buffer 86a has a gain equal to 1.0. The noninverting input end 90a is also connected to the ground 912 of the second circuit 910 via the resistance 92a. The hall voltage output end 82d of the second hall element 82 is connected to an inverting input end 90b of the differential amplifier 90 via a resistance 88b and a buffer 86b. The buffer 86b has a gain equal to 1.0. The inverting input end 90b is also connected to an output end 90c of the differential amplifier 90 via a resistance 92b. By this configuration described above, an output (i.e. the detection signal) of the second signal transmission section 80 having the second hall element 82 is expressed as the difference between the potential of the ground 912 of the second circuit 910 and potential of the output end 90c of the differential amplifier 90.

The buffers 86a and 86b have the same performance. The resistance values of the resistances 88a and 88b are equal to each other. The resistance values of the resistances 92a and 92b are also equal to each other. The buffers 86a, 86b and the resistances 88a, 88b, 92a and 92b are inserted in order to operate the differential amplifier 90 stably.

The output end 90c of the differential amplifier 90 is connected to the inverting input end 54b of the differential amplifier 54 provided in the signal output section 50d.

It should be noted that the buffers 86a, 86b, the resistances 88a, 88b, 92a and 92b, and the differential amplifier 90 are inserted in order to make the output signal (the detection signal) of the hall element 82 as a voltage signal with respect to the ground potential of the second circuit 910. Particularly, it should be noted that the differential amplifier 90 is not a "differential amplifier for obtaining the difference between the output signals of the pair of magnetic sensors (hall elements 62, 82)". As described above, the differential amplifier 54 of the signal output section 50d corresponds to the "differential amplifier for obtaining the difference between the detection signals outputted by the pair of magnetic sensors (hall elements 62, 82)".

The output end 54c of the differential amplifier 54 provided in the signal output section 50d is connected to the output terminal 12a of the signal transmission device 100e. The output terminal 12b of the signal transmission device 100e is connected to the external second circuit 910 and to the ground 912 of the second circuit 910. The signal output section 50d has the same configuration as the differential circuit 52 shown in FIG. 2.

In the output side of the signal transmission device 100e, the terminal 62b of the first hall element 62 and the terminal 82b of the second hall element 82 are connected to the ground 912 of the external second circuit 910. The output terminal 12b of the signal transmission device 100e is also connected to the ground 912 of the external second circuit 910. Therefore, the potential of the output end 54c with respect to the potential of the ground 912 becomes the output signal that is outputted between the pair of output terminals 12a, 12b.

The operation of the signal transmission device 100e will be described hereinafter.

As described above, the first hall element 62 and the second hall element 82 are arranged such that the hall voltages (the detection signals) having the same polarity are outputted when the uniform magnetic field acts on both hall elements 62, 82. On the other hand, the first input side coil 22 and the second input side coil 42 are arranged such that the input side coil 22 generates a magnetic field in a direction opposing a direction of the magnetic field generated by the other input side coil 42 when the input signal is applied. The polarity of the detection signal outputted by the first signal transmission section 60 caused by the input signal (this detection signal corresponds to the essential signal) is opposite to the polarity of the detection signal outputted by the second signal transmission section 80 caused by the same input signal (this detection signal corresponds to the essential signal).

On the other hand, the substantially uniform noise magnetic field 130 acts on the signal transmission device 100e. Of the noise magnetic field 130, the noise magnetic field component 132 affecting on the first hall element 62 and the noise magnetic field component 134 affecting on the second hall element 82 are in the same direction and have the same strength. The polarity of the detection signal outputted by the first signal transmission section 60 caused by the noise magnetic field 130 (this detection signal corresponds to the noise signal) is the same as the polarity of the detection signal outputted by the second signal transmission section 80 caused by the noise magnetic field 130 (this detection signal corresponds to the noise signal).

The relationship between the essential signal and the noise signal included in the detection signal of each of the pair of signal transmission sections 60, 80 described above is the same as the relationship between the essential signal and the noise signal included in the detection signal of each output side coil 24, 44 of the signal transmission device 100 shown in FIG. 1. Moreover, the signal transmission section 50d of the signal transmission device 100e has the same structure as the signal transmission section 50 of the signal transmission device 100 shown in FIG. 1. Therefore, the relationship among the input signal inputted between the pair of input terminals 10a, 10b, the detection signal outputted by the first signal transmission section 60, the detection signal outputted by the second signal transmission section 80, and the output signal outputted by the signal output section 50d is the same as the one shown in the schematic time chart of FIG. 3. The signal transmission device 100e shown in FIG. 11 also achieves the same performance for reducing the noise signal as the signal transmission device 100 shown in FIG. 1.

Sixth Embodiment

Figure 12:
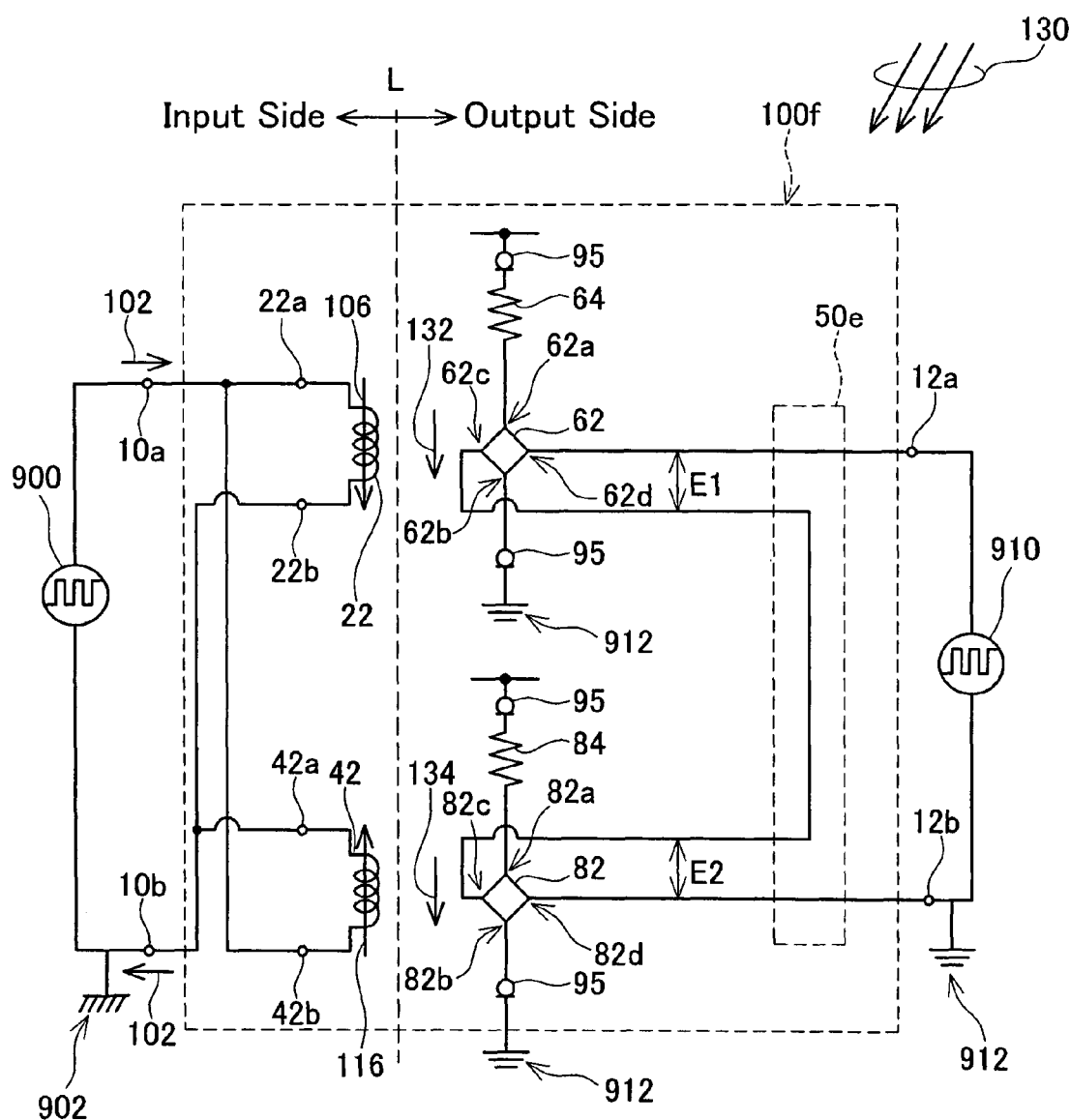
FIG. 12 is a circuit diagram of a signal transmission device of a sixth embodiment.

Next, the sixth embodiment of the present invention will be described with reference to FIG. 12. FIG. 12 shows a circuit diagram of a signal transmission device 100f according to the sixth embodiment. In FIG. 12, the same reference numerals are applied to the components that are same as those of the signal transmission device 100e shown in FIG. 11. Explanations of the components same as those of the signal transmission device 100e described in FIG. 11 are omitted.

In the signal transmission device 100f, the positional relationship among the first input side coil 22, the second input side coil 42, the first hall element 62 and the second hall element 82 is same as that of the signal transmission device 100e shown in FIG. 11. However, in the present embodiment, the detection signal outputted by the first hall element 62 is expressed as the potential E1 of the hall voltage output end 62d with respect to the potential of the hall voltage output end 62c. On the other hand, the detection signal outputted by the second hall element 82 is expressed as the potential E2 of the hall voltage output end 82c with respect to the potential of the hall voltage output end 82d. In the present embodiment, the positive and negative values of the detection signal of the second hall element 82 are inverted, unlike the case shown in FIG. 11. Therefore, in the present embodiment, the pair of hall elements (the first hall element 62 and the second hall element 82) are arranged such that the polarity of the detection signal of one of the hall elements is opposite to the polarity of the detection signal of the other hall element when the direction of the magnetic field acting on one of the hall elements is the same as the direction of the magnetic field acting on the other hall element.

The signal transmission device 100f has a signal output section 50e. The configuration of the signal output section 50e differs from the configuration of the signal output section 50d of the signal transmission device 100e shown in FIG. 11.

The signal output section 50e forms a circuit that connects the pair of hall elements 62, 82 in anti-series between the pair of output terminals 12a, 12b. The signal output section 50e connects the output terminals 12a to the hall voltage output end 62d of the first hall element 62. The signal output section 50e connects the hall voltage output end 62c of the first hall element 62 to the hall voltage output end 82c of the second hall element 82. The signal output section 50e connects the hall voltage output end 82d of the second hall element 82 to the other output terminal 12b.

The signal output section 50e connects the first hall element 62 and the second hall element 82 in anti-series. Therefore, the relationship of polarities among the input signal, the hall voltages (i.e., the detection signals) of the pair of hall elements 62, 64, and the output signals outputted from the pair of output terminals 12a, 12b will be the same as the relationship of polarities among the signals of the signal transmission device 100d shown in FIG. 5. The signal transmission device 100d shown in FIG. 12 as well can achieve the same performance for reducing the noise signal as the signal transmission device 100d shown in FIG. 5.

It should be noted that a current regulation diode 95 is inserted in order to make the hall voltage output ends 62c, 62d, 82c and 82d of the hall elements 62, 82 to have high impedance with respect to the ground 912. Therefore, the signal transmission device 100f shown in FIG. 12 does not require the differential amplifiers 70, 90 that are required for stable operation of the hall elements 62, 82. It should be noted that the circuit diagram shown in FIG. 12 is a schematic diagram, thus the resistances and the like for stable operation of the pair of hall elements 62, 82 are not illustrated.

Seventh Embodiment

Figure 13:
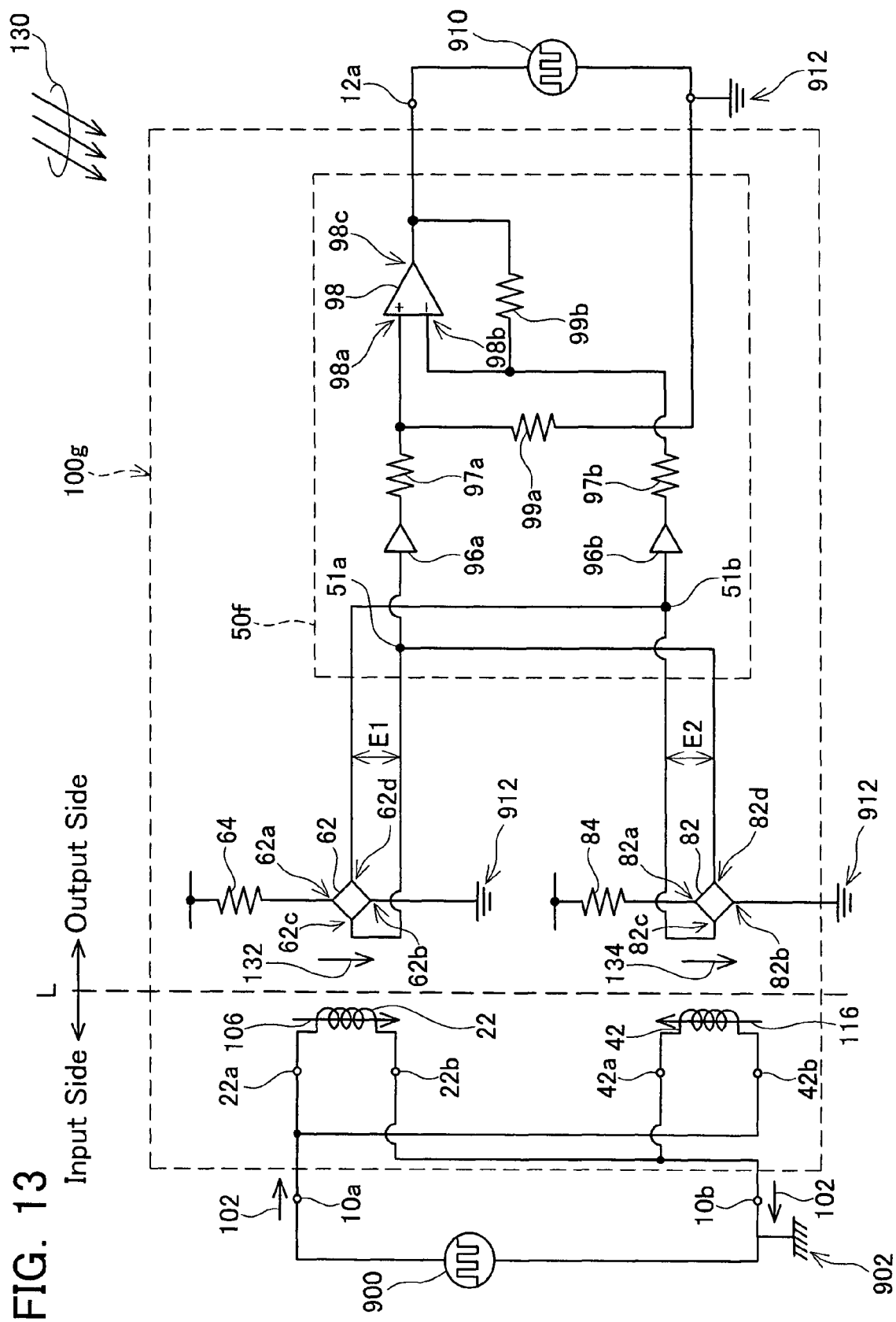
FIG. 13 is a circuit diagram of a signal transmission device of a seventh embodiment.

Next, the seventh embodiment of the present invention will be described with reference to FIG. 13. FIG. 13 is a circuit diagram of a signal transmission device 100g according to the seventh embodiment. In FIG. 13, the same reference numerals are applied to the components that are same as those of the signal transmission device 100e shown in FIG. 11. Explanations of the components same as those of the signal transmission device 10e shown in FIG. 11 are omitted.

The signal transmission device 100g shown in FIG. 13 uses the pair of hall elements 62, 82 as a pair of magnetic sensors. The hall elements 62, 82 are electrically insulated from the pair of input side coils 22, 42 respectively. The hall element 62 is magnetically joined with the input side coil 22. The hall element 82 is magnetically joined with the input side coil 42.

The pair of hall elements 62, 82 are arranged such that, when the uniform noise magnetic field 130 acts on both hall elements, the polarity of the hall voltage (detection signal) E1 outputted by the hall element 62 is the same as the polarity of the hall voltage (detection signal) E2 outputted by the hall element 82.

A signal output section 50f of the signal transmission device 100g connects the pair of hall elements 62, 82 in anti-parallel. The signal output section 50f connects the hall voltage output end 62c of the hall element 62 to the hall voltage output end 82d of the hall element 82 with a connection point 51a. The signal output section 50f connects the hall voltage output end 62d of the hall element 62 to the hall voltage output end 82c of the hall element 82 with a connection point 51b. Therefore, the difference between potential of the connection point 51b and potential of the connection point 51a is equal to the difference between the potential E1 of the hall voltage output end 62d with respect to the hall voltage output end 62c of the hall element 62 and the potential E2 of the hall voltage output end 82c with respect to the hall voltage output end 82d of the hall element 82. By this configuration, a signal, in which the essential signals included in the detection signals outputted by the pair of hall elements are doubled up and the noise signals included in these detection signals are canceled out, is outputted between the connection point 51a and connection point 51b.

It should be noted that buffers 96a, 96b, resistances 97a, 97b, 99a, 99b, and a differential amplifier 98 shown in FIG. 13 are arranged in order to stably extract an output signal corresponding to the potential difference between the connection point 51a and the connection point 51b. A noninverting input end 98a of the differential amplifier 98 is connected to the connection point 51a via the resistance 97a and the buffer 96a. The noninverting input end 98a is also connected to the ground 912 of the second circuit 910 via the resistance 99a. An inverting input end 98b of the differential amplifier 98 is connected to the connection point 51b via the resistance 97b and the buffer 96b. The inverting input end 98b is also connected to the output end 98c via the resistance 99b. By means of these connections, the differential amplifier 98 operates to convert the potential difference between the detection signals of the pair of hall elements 62, 82 connected in anti-parallel, to potential with respect to the ground potential. It should be noted that the differential amplifier 98 is not a "differential amplifier for obtaining the difference between the detection signals of the pair of magnetic sensors (hall elements 62, 82)". A signal output section 50f obtains the difference between the output signals of the pair of magnetic sensors (hall elements 62, 82) by means of the wiring among the output ends 62c, 62d of the hall element 62, the output ends 82d, 82c of the hall element 82, and the connection points 51a, 51b.

In the signal transmission devices shown in FIG. 11 through FIG. 13, the hall elements 62, 82 correspond to the magnetic sensors.

In the signal transmission device 100e shown in FIG. 11, a signal outputted from the differential amplifier 70 on the basis of the hall voltage of the hall element 62 corresponds to the detection signal outputted from one of the magnetic sensors in response to the acting magnetic field. Similarly, a signal outputted from the differential amplifier 90 on the basis of the hall voltage of the hall element 82 corresponds to the detection signal outputted from the other magnetic sensor in response to the acting magnetic field.

In the signal transmission device 100f shown in FIG. 12, the hall voltages themselves that are outputted by the pair of hall elements 62, 82 correspond to the detection signals that are outputted from the magnetic sensors in response to the acting magnetic fields.

In the signal transmission device 100g shown in FIG. 13, the hall voltages themselves that are outputted by the pair of hall elements 62, 82 correspond to the detection signals that are outputted from the magnetic sensors in response to the acting magnetic fields.

The signal transmission devices shown in FIG. 11 through FIG. 13 use the pair of hall elements as the pair of magnetic sensors. Magnetoresistive elements whose resistance values change in response to the acting magnetic fields may be used in place of the hall elements.

The signal transmission device of the first embodiment uses the pair of coils as the pair of magnetic sensors. In the signal transmission device of the first embodiment, the transformer is formed by the input side coil and the output side coil that is magnetically joined with the input side coil. In the transformer, the induced current corresponding to a change of the current inputted to the input side coil is outputted from the output side coil. The signal transmission device 100 of the first embodiment that uses the transformer is suitable for the case where the input signal is an alternating current.

On the other hand, the outputs of the hall elements or magnetoresistive elements change in accordance with the strength of the acting magnetic field. The signal transmission device that uses the hall elements or magnetoresistive elements as the magnetic sensors is suitable for the case where the input signal is a direct current.

The embodiments of the present invention has described in detail. These embodiments are merely examples and are not to limit the scope of claims. The technologies described in the patent claims include embodiments that are obtained by deforming or changing the above-described embodiments variously.

The pair of input side coils with one of the input side coils generating a magnetic field in a direction opposing a direction of the magnetic field generated by the other input side coil may also be realized in a manner as follows. The pair of input side coils whose winding directions are the same are arranged such that the axes thereof are arranged in parallel. Then, each input side coil may be connected between the pair of input terminals so that the input signal flows in the directions that are spatially opposite to each other. Alternatively, the pair of input side coils whose winding directions are opposite to each other are arranged such that the axis lines thereof are arranged in parallel. Then, each input side coil may be connected between the pair of input terminals so that the input signal flows in the spatially same direction. In either case, one of the input side coils generates a magnetic field in a direction opposing a direction of the magnetic field generated by the other input side coil.

Moreover, in the case of using the pair of detection coils as the pair of magnetic sensors (i.e., in the case where each input side coil and corresponding output side coil forms the transformer), it is effective to simultaneously perform AM modulation or FM modulation while transmitting a signal.

Further, the signal transmission device may have a plurality of pairs of signal transmission sections.

It should be noted that the expressions, "forward series", "forward parallel", "anti-series" and "anti-parallel", are depend on the definitions of terminals of the magnetic sensor.

Moreover, each of technical features described in the present specification or drawings exerts the technical utility by itself or by combining various technical features, and is not limited to the combinations described in the patent claims at the time of application. Moreover, the technologies that are described in the specification or drawings can achieve a plurality of objects simultaneously, and thus exert the technical utility by achieving one of the objects.

What is claimed is:

1. A signal transmission device, comprising:
a pair of input terminals, wherein an input signal is applied between the pair of input terminals;
a pair of output terminals electrically insulated from the pair of input terminals;
a pair of coils, wherein each of the coils is connected between the pair of input terminals and generates a magnetic field respectively in response to the input signal applied between the pair of input terminals, and a direction of the magnetic field generated by one of the coils is opposite to a direction of the magnetic field generated by the other of the coils;
a pair of magnetic sensors, wherein each of the magnetic sensors corresponds to one of the coils exclusively, each of the magnetic sensors detects the magnetic field generated by the corresponding coil, and outputs a detection signal in response to the detected magnetic field; and
a signal output section which outputs an output signal to the pair of output terminals, the output signal corresponding to a difference between the pair of detection signals outputted by the pair of magnetic sensors;
wherein:
the pair of magnetic sensors is arranged so as to output the pair of detection signals having opposite polarities when a direction of a magnetic field acting on one of the magnetic sensors is the same as a direction of a magnetic field acting on the other of the magnetic sensors,
the signal output section comprises a parallel connection of the pair of magnetic sensors, the pair of magnetic sensors being connected in parallel between the pair of output terminals, and
the signal output section adds together the pair of detection signals and outputs the result of the addition.

2. The signal transmission device according to claim 1, wherein:
the pair of magnetic sensors is a pair of detection coils.

3. The signal transmission device according to claim 1, wherein the pair of magnetic sensors is selected from a group consisting of a pair of hall elements, a pair of detection coils, and a pair of magnetoresistive elements.

4. The signal transmission device according to claim 1, wherein the pair of coils is connected in parallel between the pair of input terminals.

* * * * *